United States Patent
Murakami et al.

(10) Patent No.: US 7,220,460 B2
(45) Date of Patent: May 22, 2007

(54) THIN FILM FORMING METHOD, OPTICAL FILM, POLARIZING FILM AND IMAGE DISPLAY METHOD

(75) Inventors: Takashi Murakami, Tokyo (JP); Kazuhiro Fukuda, Tokyo (JP)

(73) Assignee: Konica Corporation, Tokyo (JP)

( * ) Notice: Subject to any disclaimer, the term of this patent is extended or adjusted under 35 U.S.C. 154(b) by 85 days.

(21) Appl. No.: 11/212,887

(22) Filed: Aug. 26, 2005

(65) Prior Publication Data

US 2005/0281960 A1 Dec. 22, 2005

Related U.S. Application Data

(63) Continuation of application No. 10/121,259, filed on Apr. 12, 2002, now abandoned.

(30) Foreign Application Priority Data

Apr. 25, 2001 (JP) .............................. 2001-127649

(51) Int. Cl.
B05D 3/06 (2006.01)
(52) U.S. Cl. ...................... 427/491; 427/493; 427/508; 427/512; 427/536; 427/539
(58) Field of Classification Search ..................... None
See application file for complete search history.

(56) References Cited

U.S. PATENT DOCUMENTS

| | | | |
|---|---|---|---|
| 4,929,319 A | 5/1990 | Dinter et al. | |
| 4,940,521 A | 7/1990 | Dinter et al. | |
| 5,143,748 A | 2/1992 | Ishikawa et al. | |
| 5,225,319 A | 7/1993 | Fukazawa et al. | |
| 5,290,378 A | 3/1994 | Kusano et al. | |
| 5,304,407 A | 4/1994 | Hayashi et al. | |
| 5,804,020 A | 9/1998 | Akao et al. | |
| 5,989,628 A * | 11/1999 | Haga et al. | 427/164 |
| 6,074,741 A | 6/2000 | Murata et al. | |
| 6,132,951 A | 10/2000 | Ezure et al. | |
| 6,419,995 B1 | 7/2002 | Kuckertz et al. | |
| 6,558,884 B1 | 5/2003 | Greener et al. | |
| 6,558,889 B1 | 5/2003 | Oishi et al. | |
| 6,652,069 B2 | 11/2003 | Toda et al. | |
| 6,759,100 B2 | 7/2004 | Fukuda et al. | |
| 6,774,018 B2 | 8/2004 | Mikhael et al. | |
| 6,844,033 B2 | 1/2005 | Shimizu et al. | |
| 6,849,306 B2 * | 2/2005 | Fukuda et al. | 427/569 |
| 7,125,591 B2 * | 10/2006 | Nakajima et al. | 428/1.33 |
| 7,158,200 B2 * | 1/2007 | Kuzuhara et al. | 349/117 |
| 2002/0037393 A1 | 3/2002 | Strobel et al. | |
| 2002/0041352 A1 * | 4/2002 | Kuzuhara et al. | 349/117 |
| 2003/0037703 A1 | 2/2003 | Saito | |
| 2003/0082412 A1 * | 5/2003 | Fukuda et al. | 428/697 |
| 2006/0199014 A1 * | 9/2006 | Il et al. | 428/411.1 |

FOREIGN PATENT DOCUMENTS

| | | |
|---|---|---|
| JP | 41-1236676 A | 8/1999 |
| JP | 2000-309871 A | 11/2000 |

OTHER PUBLICATIONS

Translation of JP 11-236679 A to Yara et al, machine translated from Thomson/Derwent.
Translation of JP 2000-309871 A to Nakao Hitoshi, machine translation from Thomson/Derwent.

* cited by examiner

Primary Examiner—Marianne Padgett
(74) Attorney, Agent, or Firm—Frishauf, Holtz, Goodman & Chick, P.C.

(57) ABSTRACT

A method of forming a layer or layers are disclosed which comprises the steps of transporting a substrate having a first surface and a second surface on the side opposite the first surface to a gap formed between a first electrode and a second electrode opposing each other, the second surface having a coefficient of kinetic friction of not more than 0.9; and subjecting the first surface of the substrate to plasma discharge treatment to form the layer at atmospheric pressure or at approximately atmospheric pressure while supplying a reactive gas to the gap.

4 Claims, 2 Drawing Sheets

THIN FILM FORMING METHOD, OPTICAL FILM, POLARIZING FILM AND IMAGE DISPLAY METHOD

This application is a Continuation application of application Ser. No. 10/121,259 filed Apr. 12, 2002 now abandoned which is hereby incorporated in its entirety herein by this reference.

FIELD OF THE INVENTION

The present invention relates to a method of forming a layer or layers on the surface of a substrate and an optical film comprising the layer, and particularly to the method comprising subjecting the surface of the substrate to plasma discharge processing at atmospheric pressure or at approximately atmospheric pressure to form the layer and an optical film having the layer formed thereby. Further, the present invention relates to an optical film used in a crystal liquid display, various displaying devices, an organic EL display, a plasma display, and the like, a polarizing plate employing the optical film, and an image display employing the optical film or the polarizing plate.

BACKGROUND OF THE INVENTION

There have been proposed various techniques for antireflection to increase transmittance and contrast or to minimize undesired reflected images in a field such as an optical lens, CRT, a liquid crystal displaying device of a computer or a word processor, and the like. As technique for antireflection, a technique is known which adjusts a refractive index and optical thickness of a multilayer as an optical interference layer to an appropriate value and reduces light reflection at the interface between the multilayer and atmospheric air. Such a multilayer is ordinarily composed of a layer of $TiO_2$, $ZrO_2$, $Ta_2O_5$, and the like as a high refractive index layer, and a layer of $SiO_2$, $MgF_2$, and the like as a low refractive index layer, and these layers are layered according to a dry coating method employing vacuum processing such as a spattering method, a vacuum evaporation method or an ion plating method. However, the vacuum processing, when materials to be processed are of large size, requires a large-scale vacuum processing apparatus, which is too expensive and time-consuming for evacuation, resulting in lowering of productivity or incapability of continuous production.

As another method for preparing an anti-reflection layer, there is a method in which a metal alkoxide such as titanium alkoxide or silicon alkoxide is coated on a substrate, dried and heated to form a metal oxide layer on the substrate. However, this method requires too high temperature such as 300° C. as the heating temperature, and may result in damage of the substrate. In contrast, the method employing a relatively low temperature such as 100° C. as the heating temperature, which is disclosed in, for example, Japanese Patent O.P.I. Publication No. 8-75904, is time-consuming for the layer preparation. Both methods have problem.

In order to solve the above problem regarding preparation time and temperature, there is a proposal described in Japanese Patent O.P.I. Publication No. 9-21902, in which an alkoxide of Ti, Zr, Ta, or In and a compound having two or more acryloyl, methacryloyl, allyl or vinyl groups in the molecule are used in combination at a low temperature to prepare a high refractive index material. There is disclosed in Japanese Patent O.P.I. Publication No. 7-209503 an optical film coating composition comprising as a main component a copolymer of an organosilicon compound having both a polymerizable group such as vinyl group, an allyl group, an acryloyl group or a methacryloyl group and a hydrolyzable group such as an alkoxy group, with a polymerizable, unsaturated monomer, which provides a layer with a binder resin component and an inorganic component uniformly mixed in a molecular level. There is further the description in this reference that the composition as described above is coated and polymerized by being heated at 100° C. for a long time or irradiated with ionizing radiation to form a film.

Further, there is a technique disclosed in Japanese Patent O.P.I. Publication Nos. 8-295846 and 9-220791, in which a composition comprising active organometallic compounds and metal oxides or silane compounds is hardened by heat or ionizing radiation to prepare an anti-reflection layer. Further, there is another technique disclosed in Japanese Patent O.P.I. Publication Nos. 5-270864, 5-279598, 6-11602, 8-122501, 8-297201, 9-21902 and 9-25350, in which a composition comprising no active organometallic compounds is hardened employing electron beam or ultraviolet ray as ionizing radiation ray to prepare an antireflection layer. However, there are the problems in these techniques that a part of the organic components remains unreacted, and the remained unreacted components vary with time. Therefore, the resulting anti-reflection layer causes change in the refractive index, and gradually loses an anti-reflection property.

As a method for solving the problems as described above, in that use of a vacuum apparatus results in lowering of productivity or an organic substance remains in the method in which a coated metal oxide is hardened by application of energy, there is a method as proposed in Japanese Patent O.P.I. Publication Nos. 11-133205, 2000-185362, 11-61406, 2000-147209, and 2000-121804, in which a film having an antireflection property is formed by plasma discharge processing under atmospheric pressure or under approximately atmospheric pressure.

However, although an anti-reflection film can be formed in only a small area according to the method proposed above, it is difficult to form a uniform anti-reflection film on a wide and long substrate, and it is extremely difficult to continuously form an anti-reflection film with a constant refractive index and a constant optical layer thickness.

SUMMARY OF THE INVENTION

An object of the invention is to provide a method of manufacturing a uniform thin multiple layer on a substrate continuously and at reduced cost and an optical film having on the surface the layer formed according to the method.

Another object of the invention is to provide a polarizing plate or an image display employing the optical film.

DETAILED DESCRIPTION OF THE INVENTION

The above objects of the invention can be attained by the following constitutions:

1. A method of forming a layer or layers, the method comprising the steps of (a) transporting a substrate having a first surface and a second surface on the side opposite the first surface to a gap formed between a first electrode and a second electrode opposing each other, the second surface having a coefficient of kinetic friction of not more than 0.9; and (b) subjecting the first surface of the substrate to plasma discharge treatment to form the layer at atmospheric pressure or at approximately atmospheric pressure while supplying a reactive gas to the gap.

2. A method of forming a layer or layers, the method comprising the step of subjecting the surface of a substrate, the substrate having a thickness of from 10 to 60 μm and having a tensile strength of not less than $1.4 \times 10^2$ N/mm$^2$, to plasma discharge treatment to form the layer at atmospheric pressure or at approximately atmospheric pressure at a gap formed between a first electrode and a second electrode opposing each other while supplying a reaction gas to the gap.

3. A method of forming a first layer, the method comprising the step of subjecting the surface of a substrate or a second layer provided on a substrate to plasma discharge treatment to form the first layer at atmospheric pressure or at approximately atmospheric pressure at a gap formed between a first electrode and a second electrode opposing each other while supplying a reaction gas to the gap, wherein the substrate has a moisture content of not more than 4% at 23° C. and 80% RH.

4. A method of forming a first layer, the method comprising the step of subjecting the surface of a substrate or a second layer provided on a substrate to plasma discharge treatment to form the first layer at atmospheric pressure or at approximately atmospheric pressure at a gap formed between a first electrode and a second electrode opposing each other while supplying a reaction gas to the gap, wherein the substrate has been stretched in the transverse direction.

5. The method of item 3 or 4 above, wherein the second layer provided on the substrate is a hardened resin layer in which a monomer or an oligomer each having an ethylenically unsaturated double bond has been polymerized and hardened.

6. The method of any one of items 1 through 5 above, wherein the substrate is a cellulose ester film.

7. The method of item 6 above, wherein the cellulose ester film comprises a cellulose ester having a total acyl substitution degree of from 2.55 to 2.95.

8. An optical film having a layer or layers formed according to the method of any one of items 1 through 7.

9. A polarizing plate employing the optical film of item 8 as the protective film.

10. An image display employing the optical film of item 8 above.

The present invention will be explained below.

The present invention provides a method in which a layer or layers with reduced layer thickness is formed on a substrate, the method comprising the step of subjecting the surface of the substrate to plasma discharge treatment at atmospheric pressure or at approximately atmospheric pressure while supplying a reactive gas to a gap formed between a first electrode and a second electrode opposing each other, and provides an optical film with a layer or layers formed according to the method.

The method according to item 1 above is a method in which a layer or layers are formed on a substrate, the method comprising the steps of (a) transporting a substrate having a first surface and a second surface on the side opposite the first surface to a gap formed between a first electrode and a second electrode opposing each other, the second surface having a coefficient of kinetic friction of not more than 0.9; and subjecting the first surface of the substrate to plasma discharge treatment to form the layer at atmospheric pressure or at approximately atmospheric pressure while supplying a reactive gas to the gap. Hereinafter, the second surface of the substrate opposite the first surface to be subjected to plasma discharge treatment is referred to also as the rear surface of the substrate. The plasma discharge treatment described above is called an ordinary pressure plasma method or an atmospheric pressure plasma method (hereinafter, the above plasma discharge treatment at atmospheric pressure or approximately at atmospheric pressure is also abbreviated as simply the plasma discharge treatment). The method described above is a method in which a layer or layers are formed on a substrate by subjecting the surface of the substrate to plasma generated by electric discharge at atmospheric pressure or approximately at atmospheric pressure at a gap formed between opposing electrodes while supplying a reaction gas to the gap. When the layer or layers are continuously formed on a long substrate, this method, although the layer can be formed at high speed, has problem in that unevenness of the layer thickness is likely to be produced. An extensive study has been made in order to solve this problem, and it has been found that unevenness of the layer thickness is markedly minimized by controlling slidability of the rear surface of the substrate opposite the surface on which the layer is formed. That is, the present inventors have found that in order to form a uniform layer on a substrate according to plasma discharge treatment, it is preferable to form a layer or layers on a substrate, by subjecting the first surface of the substrate to plasma discharge treatment while transporting a gap between opposing electrodes so that the second surface contacts the electrode on one side, the second surface of the substrate being opposite the layer to be formed and having a coefficient of dynamic friction of not more than 0.9. The coefficient of dynamic friction exceeding 0.9 often lowers smooth transportability, resulting in unevenness of layer thickness. In the invention, the coefficient of dynamic friction of not more than 0.9 provides stable transportability whereby a layer or layers with a uniform layer thickness can be obtained. The coefficient of dynamic friction is preferably from 0.2 to 0.6 in forming a more uniform layer. The substrate with a surface having a coefficient of dynamic friction exceeding 0.9 is likely to zigzag on the electrode in contact with the surface, resulting in undesired results that the substrate undulates or wrinkles to cause unevenness.

The coefficient of dynamic friction herein referred to can be obtained from measurements with respect to an interface formed between two of the rear surface of the substrate contacting each other. In order to obtain a desired coefficient of dynamic friction, it is preferred that the substrate itself contains particles or a particle-containing layer is provided on a substrate to form a concavo-convex surface. The particulars will be explained later.

Unevenness (irregularities) such as wrinkles or folds, which, when the first surface of the substrate is subjected to plasma discharge treatment particularly with the rear surface (of the substrate) contacting a rotating electrode, have hitherto occurred at a discharge section, are minimized by providing particles on the rear surface of the substrate.

Further, the substrate with the rear surface having a coefficient of dynamic friction falling within the claimed range restrains zigzag transportation of the substrate on the rotating electrode, and therefore, can continuously form a layer or layers on the substrate over a long time, providing an optical film with high quality.

The method according to item 2 above is a method in which a uniform layer can be formed on even a substrate with a small thickness. The substrate with a small thickness had the problem that wrinkles were likely to occur at plasma discharge treatment, but it has been proved that a substrate with a thickness of from 10 to 60 μm and having a tensile strength of not less than $1.4 \times 10^2$ N/mm$^2$, overcomes this problem. The tensile strength of less than $1.4 \times 10^2$ N/mm$^2$ is undesirable in that unevenness is likely to occur. Tensile strength of the substrate in the invention is determined according to a method as defined in JIS K7127-1989. In the invention, the tensile strength of the substrate is measured employing a tensile tester TENSILON RTA-100 produced by Olyentech Co., Ltd., provided that a substrate cut to the same size as the specimen No. 1 as described in this JIS is pulled at a tensile speed of 100 mm/min. In the invention, the tensile strength of the substrate having a thickness of from 10 to 60 μm is preferably not less than $1.4 \times 10^2$ N/mm$^2$, more preferably not less than $1.45 \times 10^2$ N/mm$^2$, and most preferably not less than $1.5 \times 10^2$ N/mm$^2$. It is preferred that the tensile strength in the longitudinal (mechanical) direction and that in the transverse direction of the substrate both are preferably not less than $1.4 \times 10^2$ N/mm$^2$, and it is more preferred that in addition to the aforementioned, the both tensile strengths of the substrate are substantially the same. Typically, the tensile strength in the transverse direction is within the range of preferably ±30%, more preferably ±15%, and most preferably ±10%, of the tensile strength in the longitudinal (mechanical) direction.

It is preferred that the substrate is brought into contact with an electrode with a specific tension applied and subjected to plasma discharge treatment to form a layer or layers on the substrate, and use of the substrate having a tensile strength falling within the range as claimed, even if the substrate is a thin one, can form a uniform layer on the substrate surface, providing an optical film with high quality.

The method according to item 3 above is a method comprising the step of subjecting a substrate having a moisture content of not more than 4% at 23° C. and 80% RH to plasma discharge treatment to form a layer or layers on the substrate surface. The moisture content of the substrate is preferably 0.5 to 3%. The present inventors have found that particularly when a cellulose ester film having a moisture content of from 0.5 to 4% at 23° C. and 80% RH is subjected to plasma discharge treatment, a layer or layers with reduced unevenness of layer thickness can be formed on the cellulose ester film surface. A cellulose ester film ordinarily contains a small amount of moisture. It is considered that when the moisture in a more than necessary amount is released to a discharge section at plasma discharge treatment, it plays any roll in causing unevenness of layer thickness, although the reason is not clear. It has been found that a substrate having a moisture content exceeding 4% at 23° C. and 80% RH tends to produce unevenness of layer thickness or increase haze, resulting in undesirable results. The present invention can form a uniform layer with reduced unevenness of layer thickness on a cellulose ester film having a moisture content of from 0.5 to 4% at 23° C. and 80% RH. The moisture content of the cellulose ester film can be adjusted by varying the total acyl substitution degree, kinds of an acyl group, kinds of plasticizer contained in it or the content thereof.

Item 4 above comprises a method of subjecting a substrate, for example, a cellulose ester film, which has been stretched in the transverse direction, to plasma discharge treatment to form a layer or layers with reduced unevenness of layer thickness on the substrate surface. It has been found that a cellulose ester film prepared according to a solution cast film manufacturing method is contracted at a drying step, particularly in the transverse direction, which is one of elements producing unevenness of layer thickness at electric discharge treatment of the film. On the contrary, it is considered that the cellulose ester film stretched in the transverse direction can be brought into close contact with an electrode due to its excellent flatness, and therefore, treatment unevenness (unevenness of layer thickness) is difficult to occur at plasma discharge treatment, resulting in formation of a uniform layer. The cellulose ester film used in the optical film of the invention is preferably a cellulose ester film stretched in the transverse direction by a factor of not less than 1.03, and more preferably a cellulose ester film stretched both in the transverse direction by a factor of not less than 1.03, and in the mechanical direction by a factor of not less than 1.03. Such a cellulose ester film can provide an optical film having a layer or layers with reduced unevenness of layer thickness.

Item 5 above comprises a method of providing, on a substrate, a hardened resin layer formed by polymerizing a monomer or an oligomer each having an ethylenically unsaturated double bond as described later and hardened, and subjecting the resulting resin layer to plasma discharge treatment to form a layer or layers with reduced unevenness of layer thickness on the resin layer surface. This method is especially effective for the substrate as recited in item 3 or 4 above. The hardened resin layer is preferably hardened by UV light irradiation.

As a method of forming a layer or layers with reduced unevenness of layer thickness by plasma discharge treatment, the methods of items 1 to 4 above are effective, but by a combination thereof, an optical film having a more uniform layer can be obtained (the method of item 8 above).

Next, the present invention will be explained in detail.

Examples of the substrate in the invention include a cellulose ester film, a polyester film, a polycarbonate film, a polystyrene film, a polyolefin film, a cellulose type film, and other resin film. Examples of the cellulose ester film include cellulose a diacetate film, a cellulose acetate butyrate film, a cellulose acetate propionate film, a cellulose acetate phthalate film, a cellulose triacetate film, and a cellulose nitrate film. Examples of the polyester include polyethylene terephthalate, polyethylene naphthalate, polybutylene naphthalate, poly(1,4-dimethylenecyclohexylene) terephthalate, and a copolyester comprising them as structural units. Examples of a polycarbonate film include a bisphenol A polycarbonate film. Examples of a polystyrene film include a syndiotactic polystyrene film. Examples of a polyolefin film include a polyethylene film and a polypropylene film. Examples of a polyvinyl alcohol type film include a polyvinyl alcohol film and an ethylene vinyl alcohol film. Examples of a cellulose type film include a cellophane film. Examples of other resin film include a norbornene resin film, a polymethylpentene film, a polyetherketone film, a polyimide film, a polyethersulfone film, a polysulfone film, a polyetherketoneimide film, a polyamide film, a fluorine-containing resin film, a nylon film, a polymethyl methacrylate film, an acryl film, a polyarylate film, and a polyvinylidene chloride film.

A film obtainable from an appropriate mixture of these film materials can be used. For example, a film comprising commercially available materials such as Zeonecks (produced by Nippon Zeon Co., Ltd.) or ARTON (produced by Nippon Gosei Gomu Co., Ltd.) can be also used. The substrate suitable for the invention can be prepared even from materials such as polycarbonate, polyacrylate, polysulfone and polyethersulfone, each having a high specific birefringence, by appropriately adjusting a solution casting condition, a melt extrusion condition, or a stretching condition in the transverse or mechanical direction. The substrate in the invention is not specifically limited to those described above. The substrate in the invention is preferably a cellulose ester film (item 6 above).

The hardened resin layer may be a layer having various functions, for example, an anti-glare layer or a clear hard coat layer.

Of the films described above, the cellulose ester film is especially preferably used as the substrate in the invention.

Next, cellulose ester, which is material of the cellulose ester film especially preferably used as the substrate in the invention, will be explained in detail.

The cellulose ester film in the invention is preferably a film employing cellulose ester in which the hydrogens of the hydroxyl groups of cellulose are substituted with 2.55 to 2.95 of an acyl group, particularly an acyl group having a carbon atom number of from 2 to 4. Examples of such a cellulose ester include cellulose diacetate, cellulose triacetate, cellulose acetate butyrate, and cellulose acetate propionate. Of these, cellulose triacetate, cellulose acetate butyrate, and cellulose acetate propionate are preferable. Of these preferable cellulose esters, cellulose ester having an acetyl substitution degree of not less than 1.6 is especially preferable. Raw materials for the cellulose ester are not specifically limited, and include cotton lint, tree pulp (derived from a coniferous tree or a broad-leaved tree) and kenaf. These raw materials may be used in combination in an arbitrary amount ratio. The cellulose ester is prepared by esterifying cellulose raw materials with an acylating agent, for example, an acid anhydride (acetic anhydride, propionic anhydride, or butyric anhydride), in an organic acid such as acetic acid or an organic solvent such as methylene chloride in the presence of a protic catalyst such as sulfuric acid. A cellulose ester containing different acid radicals can be prepared according to a method described in Japanese Patent O.P.I. Publication No. 10-45804. The acyl substitution degree of the cellulose ester can be measured according to a method as defined in ASTM-817-96.

The number average molecular weight (Mn) of the cellulose ester is preferably 70,000 to 250,000, in providing good mechanical strength in a molded film, and an optimum dope viscosity, and more preferably 80,000 to 15,000.

The cellulose ester film is manufactured according to a method generally called a solution cast film manufacturing method as described later. This method comprises the steps of casting a dope (a cellulose ester solution) from a pressure die on a metal support (hereinafter referred to also as simply a metal support) for casting such as an endless metal belt support (for example, a stainless steel belt) or a rotating metal drum support (for example, a cast iron drum plated with chromium) to form a web (a dope layer) on the metal support, peeling the web from the metal support, and drying to manufacture a cellulose ester film.

The solvent used for preparing a cellulose ester dope is preferably a solvent having an appropriate boiling point which is capable of dissolving cellulose esters. Examples of the solvents include methylene chloride, methyl acetate, ethyl acetate, amyl acetate, acetone, tetrahydrofuran, 1,3-dioxolane, 1,4-dioxane, cyclohexanone, ethyl formate, 2,2,2-trifluoroethanol, 2,2,3,3-tetrafluoro-1-propanol, 1,3-difluoro-2-propanol, 1,1,1,3,3,3-hexafluoro-2-methyl-2-propanol, 1,1,1,3,3,3-hexafluoro-2-propanol, 2,2,3,3,3-pentafluoro-1-propanol, nitroethane, 1,3-dimethyl-2-imidazolidinone, and methyl actoacetate. Of these, a halogenated organic compound such as methylene chloride, dioxolane derivatives, methyl acetate, ethyl acetate and acetone are preferred.

A peeling tension at which the web is peeled from the metal support is preferably not more than 250 N/m, and a transporting tension at which the web is transported is preferably not more than 300 N/m, more preferably not more than 250 N/m, and still more preferably 100 to 20 N/m. The peeled web is preferably dried at the drying step while being stretched in the transverse direction by applying a tension in a tenter, in that an optical film with high durability comprising a metal oxide layer can be obtained.

The stretching magnification of the web in a tenter is preferably 1.01 to 1.5. The stretching is preferably carried out both in the transverse direction of the film and in the longitudinal direction of the film biaxially). The residual solvent of the web at the stretching is preferably 3 to 30% by weight, in that a high durable metal oxide layer of an optical film can be obtained.

The residual solvent content herein referred to is expressed employing the following formula:

Residual solvent content (%)={(weight of web before heat treatment−weight of web after heat treatment)/weight of web before heat treatment}×100 wherein the heat treatment represents heating the web at 115° C. for one hour.

The cellulose ester film in the invention preferably contains a plasticizer. The plasticizers are not specifically limited, but the plasticizers include a phosphate plasticizer, a phthalate plasticizer, a trimellitate plasticizer, a pyromellitate plasticizer, a glycolate plasticizer, a citrate plasticizer, and a polyester plasticizer. Examples of the phosphate plasticizer include triphenyl phosphate, tricresyl phosphate, cresyldiphenyl phosphate, octyldiphenyl phosphate, diphenylbiphenyl phosphate, trioctyl phosphate, and tributyl phosphate. Examples of the phthalate include diethyl phthalate, dimethoxyethyl phthalate, dimethyl phthalate, dioctyl phthalate, dibutyl phthalate, di-2-ethylhexyl phthalate, and butylbenzil phthalate. Examples of the trimellitate plasticizer include tributyl trimellitate, triphenyl trimellitate, and trimethyl trimellitate. Examples of the pyromellitate plasticizer include tetrabutyl pyromellitate, tetraphenyl pyromellitate, and tetraethyl pyromellitate. Examples of a glycerin ester plasticizer include triacetin, and tributyrin. Examples of the glycolate plasticizer include ethylphthalylethyl glycolate, methylphthalylethyl glycolate, and butylphthalylbutyl glycolate. Examples of other carboxylic acid esters include butyl oleate, metylacetyl ricinolate, dibutyl sebacate, and various kinds of trimellitic acid esters. Of these plasticizers, the phosphate plasticizer and the glycolate plasticizer are preferable.

These plasticizers may be used singly or in combination. The plasticizer content of the cellulose ester film is preferably 1 to 30% by weight % based on weight of the cellulose ester, in view of film properties or processability.

An ultraviolet (UV) absorbent used in the substrate in the invention will be explained below. It is preferred that the cellulose ester film in the invention contains a UV absorbent, since an image display employing the cellulose ester film minimizes deterioration occurring when it is placed outdoors.

The UV absorbent in the invention is preferably a UV absorbent which has excellent absorption of ultraviolet light having a wavelength of 370 nm or less, and has reduced absorption of visible light having a wavelength of 400 nm or more. The UV absorbents used in the invention include an oxybenzophenone compound, a benzotriazole compound, a salicylic acid ester compound, a benzophenone compound, a cyanoacrylate compound and a nickel complex compound, but are not limited thereto.

Examples of the benzotriazole type UV absorbent include 2-(2'-hydroxy-5'-methylphenyl)-benzotriazole, 2-(2'-hydroxy-3',5'-di-tert-butylphenyl)-benzotriazole, 2-(2'-hydroxy-3'-tert-butyl-5'-methylphenyl)-benzotriazole, 2-(2'-hydroxy-3',5'-di-t-butylphenyl)-5-chlorobenzotriazole, 2-(2'-hydroxy-3'-(3",4",5",6"-tetrahydrophthalimidomethyl)-5'-methylphenyl)-benzotriazole, 2,2-methylenebis(4-(1,1,3,3-tetramethylbutyl)-6-(2H-benzotriazole-2-yl)phenol), 2-(2'-hydroxy-3'-t-butyl-5'-methylphenyl)-5-chlorobenzotriazole, 2-(2H-benzotriazole-2-yl)-6-(straight-chained or branched dodecyl)-4-methylphenol, octyl-3-[3-t-butyl-4-hydroxy-5-(chloro-2H-benzotriazole-2-yl)phenyl]propionate, and 2-ethylhexyl-3-[3-tert-butyl-4-hydroxy-5-(5-chloro-2H-benzotriazole-2-yl)phenyl]propionate. TINUVIN 109, TINUVIN 171, and TINUVIN 326 (each produced by Ciba Specialty Co., Ltd.) are commercially available, and preferably used.

The benzophenone type UV absorbent is also one of UV absorbents useful for the invention. Examples of the benzophenone type UV absorbent include 2,4-dihydroxybenzophenone, 2,2'-dihydroxy-4-methoxybenzophenone, 2-hydroxy-4-methoxy-5-sulfobenzophenone, and bis(2-methoxy-4-hydroxy-5-benzoylphenylmethane).

As UV absorbents preferably used in the optical film of the invention, the benzotriazole or benzophenone type UV absorbent is preferably used which has high transparency, and minimizes deterioration of a polarizing plate or a liquid crystal. The benzotriazole type UV absorbent is especially preferably used which minimizes undesired coloration. UV absorbents are preferable, which do not bleed out nor volatilize during cellulose ester film manufacturing.

In the invention, particles as a matting agent are preferably added to the substrate in order to adjust coefficient of kinetic friction of the rear surface of the substrate.

The substrate useful for the invention, when it contains a matting agent, can provide a good transportability or an easily windable property. As a matting agent, particles with the smallest possible particle size are preferable. The matting agent particles include inorganic fine particles such as silicon dioxide, titanium dioxide, aluminum oxide, zirconium oxide, calcium carbonate, kaolin, talc, burned calcium silicate, hydrated calcium silicate, aluminum silicate, magnesium silicate, and calcium phosphate, and organic fine particles such as polymethacrylic acid-methylacrylate resin powder, acrylstyrene resin powder, polymethylmethacrylate resin powder, silicon resin powder, polystyrene resin powder, polycarbonate resin powder, benzoguanamine resin powder, melamine-resin powder, polyolefin resin powder, polyester resin powder, polyamide resin powder, polyimide resin powder and polyethylene fluoride resin powder. The matting agent particles used in the invention are not limited thereto, but is preferably cross-linked polymer particles.

Of these matting agents, silicon dioxide is especially preferable in adjusting a coefficient of kinetic friction or in providing a reduced haze. The particles such as silicon dioxide particles are often surface treated with an organic compound, especially with a compound having a methyl group. Such surface treated particles are preferable in giving a reduced haze to the film. Examples of the organic compound used in the surface treatment include halogenated silanes, alkoxysilanes (especially, methylsilane), silazanes, and siloxanes.

The particle content of the substrate is preferably from 0.005 to 0.5% by weight, and more preferably from 0.05 to 0.4% by weight, based on the substrate. The secondary particles of the particles have an average particle size of preferably 0.005 to 1.0 μm. The particles having a larger average particle size have a high sliding property, and on the contrary, the particles having a smaller average particle size have a good transparency. The primary particles of the particles have an average particle size of preferably not more than 20 nm, more preferably from 5 to 16 nm, and most preferably 5 to 12 nm. It is preferred that these particles are contained in the substrate so as to produce peaks of 0.01 to 1.0 μm on the surface of the substrate. It is also preferred that the number of peaks having a height of at least 0.1 μm, which exist on the surface of the substrate, is from 10 to 500 per 1000 μm². The number of particles is preferably 5 to 500 per a 1000 μm² area of the substrate section which represents 10 μm (a depth from the surface of the substrate)×100 μm (a length in the direction normal to the depth direction) in the substrate section. The peak or particle number as described above is determined by observing an electron microscopic photograph of the surface or section of the substrate.

Examples of the silicon dioxide particles include, for example, Aerosil 200, 200V, 300, R972, R972V, R974, R202, R812, OX50, or TT 600 (each produced by Nihon Aerosil Co., Ltd.), and are preferably Aerosil 200V, R972, R972V, R974, R202 or R812. These particles may be used as a mixture of two or more kinds thereof. When two or more kinds of the particles are used, they may be mixed at any amount ratio. Two matting agents different in kinds or average particle size, for example, Aerosil 200V and R972 can be used in a 200V to R972 amount ratio of from 0.1:99.9 to 99.9:0.01. As zirconium oxide particles, commercially available products, for example, Aerosil R976 and R811 each produced by Nihon Aerosil Co., Ltd., can be used.

Examples of the organic particles include silicon resin particles such as Tospearl 103, 105, 108, 120, 145, 3210, or 240, each produced by Toray Co., Ltd.

In the invention, the average primary particle size of the particles in the invention is measured employing a transmission type electron microscope. That is, the primary particle size of one hundred particles is measured through the transmission type electron microscope at a magnifying factor of 50,000 to 400,000, and its average value is defined as the average primary particle size.

The apparent specific gravity of the particles is preferably 70 g/liter, more preferably from 90 to 200 g/liter, and most preferably from 100 to 200 g/liter. The particles of higher apparent specific gravity are preferably used in preparing a dispersion having a high concentration, improving a haze or minimizing aggregates. Such particles are especially preferably used in preparing the dope in the invention having a high solid concentration.

The silicon dioxide particles having an average primary particle size of not more than 20 nm and an apparent specific gravity of not less than 70 g/liter can be prepared, for example, by burning a mixture of hydrogen and a gaseous silicon tetrachloride at 1,000 to 1,200° C. in air. The apparent specific gravity referred to in the invention is computed from the following formula:

Apparent specific gravity (g/liter)=weight of silicon dioxide particles (g)/volume of silicon dioxide particles (1)

wherein the volume of silicon dioxide particles is the volume in which a certain amount of silicon dioxide particles are put in a messcylinder and measured employing the messcylinder and the weight of silicon dioxide particles is the weight of the silicon dioxide particles put in the messcylinder.

As the methods of preparing a dispersion of the particles useful for the invention and the method of adding the dispersion to the dope, the following three are exemplified.

(Method A)

An organic solvent and the particles are mixed in a disperser with stirring, and dispersed to obtain a dispersion of the particles. The dispersion is added to a cellulose ester dope, and stirred.

(Method B)

An organic solvent and the particles are mixed in a disperser with stirring, and dispersed to obtain a dispersion of the particles. Separately, a small amount of cellulose ester is dissolved in an organic solvent with stirring, and added with the above dispersion and stirred to obtain a particle addition solution. The resulting particle addition solution is uniformly mixed with a cellulose ester dope in an in-line mixer.

(Method C)

A small amount of cellulose ester is dissolved in a solvent with stirring, added with particles, and dispersed in a disperser to obtain a particle addition solution. The resulting particle addition solution is mixed with a cellulose ester dope in an in-line mixer.

The method A is preferred in that silicon dioxide particles are effectively dispersed in a solvent, and the method C is preferred in that dispersed silicon dioxide particles in a solvent are difficult to be re-aggregated. The method B is more preferred both in that silicon dioxide particles are effectively dispersed in a solvent, and in that dispersed silicon dioxide particles in a solvent are difficult to be re-aggregated.

(Dispersion Method)

When silicon dioxide particles are dispersed in a solvent to obtain a silicon dioxide dispersion, the silicon dioxide concentration of the dispersion is preferably 5 to 30% by weight, more preferably 10 to 25% by weight, and most preferably 15 to 20% by weight.

The content of silicon dioxide particles in the cellulose ester film is preferably from 0.01 to 0.5 parts by weight, more preferably from 0.05 to 0.2 parts by weight, and most preferably from 0.08 to 0.12 parts by weight, based on 100 parts by weight of cellulose ester. A higher content of the particles is superior in coefficient of kinetic friction, and on the contrary, a lower content of the particles is superior in lowering haze and minimizing occurrence of aggregates.

The organic solvents used in the dispersion are preferably lower alcohols. Examples of the lower alcohols include methanol, ethanol, propyl alcohol, isopropyl alcohol, and butanol. Solvents other than the lower alcohols are not specifically limited, and solvents used in the preparation of the cellulose ester dope are preferred ordinary dispersers may be employed. Dispersers are mainly divided into two types; a media disperser and a medialess disperser. Silicon dioxide particles are preferably dispersed by the medialess disperser which results in decrease in haze. Cited as medialess dispersers are a ball mill, a sand mill, a dyno mill, and the like. As medialess dispersers, there are an ultrasonic type, a centrifugal type, a high pressure type, and the like. In the present invention, the high pressure type disperser is preferred. The high pressure disperser is an device which generates special conditions such as high shearing, high pressure, and the like by passing a composition prepared by mixing particles with solvents into a narrow pipe at a high speed. When the high pressure disperser is used, the maximum pressure in the interior of a narrow pipe having a diameter of for example, 1 to 2,000 μm is preferably at least 9.8 Mpa, and more preferably at least 19.6 Mpa. Further, at the time, a disperser that allows a maximum attainable speed of not less than 100 m/second as well as a heat transfer rate of not less than 420 kJ/hour is preferred.

The high pressure dispersers as described above include an ultra-high pressure disperser (with a trade name of Microfluidizer) manufactured by Microfluidics Corporation, and Nanomizer manufactured by Nanomizer Co. Listed as devices other than those are Manton-Gaulin type high pressure disperser, for example, Homogenizer manufactured by Izumi Food Machinery, UHN-01 manufactured by Sanwa Kikai Co., Ltd., and the like.

In the invention, the particles described above are preferably contained in the cellulose ester film to be uniformly distributed in the thickness direction. It is more preferable that the particles are contained in the cellulose ester film to be located near the surface of the film. For example, it is preferred that two kinds of dopes are simultaneously cast on a support from a single die by a co-extrusion method so that the dope containing particles is arranged on the surface side, whereby haze is reduced and coefficient of dynamic friction is lowered. Further, it is more preferred that three kinds of dopes are simultaneously cast on a support so that the two dopes containing particles are arranged on both surface sides.

In the invention, particles as a matting agent are preferably added to the substrate in order to adjust coefficient of kinetic friction of the rear surface of the substrate.

When a backing coat layer is provided on the rear surface of the substrate opposite the layer in the invention to be formed, the back coating layer preferably contains particles and a binder resin in order to adjust a coefficient of dynamic friction of the surface of the backing coat layer is preferably provided on the surface. The coefficient of dynamic friction can be adjusted by the particle size, addition amount or material of the particles added.

The particles in the back coating layer useful for the invention include particles of inorganic compounds or organic compounds. The kinds, particle size, apparent specific gravity or dispersion methods of the particles are the same as those denoted above in the particles contained in the substrate.

The content of the particles in the back coating layer is preferably from 0.01 to 1 parts by weight, more preferably from 0.05 to 0.5 parts by weight, and most preferably from 0.08 to 0.2 parts by weight, based on 100 parts by weight of binder resin. A higher content of the particles lowers coefficient of kinetic friction, and on the contrary, a lower content of the particles lowers haze and minimize occurrence of aggregates.

It is preferred that these particles are contained in the backing layer so as to produce peaks of 0.01 to 1.0 μm on the surface of the backing layer. It is also preferred that the number of peaks having a height of at least 0.1 μm, which exist on the backing layer, is from 10 to 500 per 1000 μm$^2$. The number of particles is preferably 5 to 500 per a 1000 μm$^2$ area of the section of the substrate with the backing layer which represents 10 μm (a depth from the backing layer surface)×100 μm (a length in the direction normal to the depth direction) in the section of the substrate with the backing layer. The peak or particle number as described above is determined by observing an electron microscopic photograph of the surface of the backing layer or an electron microscopic photograph of the section of the backing layer and the substrate.

The organic solvent used for forming the back coating layer is not specifically limited, but since the back coating layer can provide an anti-curl property of the substrate, an organic solvent, which is capable of dissolving or swelling the substrate or resin used as material of the substrate, is effective. The solvent is suitably selected in view of curling degree of substrate, kinds of substrate materials, proportion of substrate materials or coating amount.

The organic solvents used for forming the back coating layer are not specifically limited, but include, for example, benzene, toluene, xylene, dioxane, acetone, methyl ethyl ketone, N,N-dimethylformamide, methyl acetate, ethyl acetate, trichloroethylene, methylene chloride, ethylene chloride, tetrachloroethane, trichloroethane, chloroform, N-methylpyrrolidone, and 1,3-dimethyl-2-imidazolidinone. The organic solvents, which do not dissolve a back coating layer coating composition, include methanol, ethanol, n-propyl alcohol, i-propyl alcohol, and n-butanol.

The coating methods of the back coating layer coating composition include those employing a gravure coater, a dip coater, a wire-bar coater, a reverse coater, and an extrusion coater, etc. When the back coating layer is coated employing these coater, the coating liquid thickness (also referred to as wet thickness) of the layer is preferably from 1 to 100 μm, and more preferably from 5 to 30 μm.

Examples of the resin used in the back coating layer include vinyl type homopolymers or copolymers such as vinyl chloride/vinyl acetate copolymer, vinyl chloride resin, vinyl acetate resin, vinyl acetate-vinyl alcohol copolymer, partially hydrolyzed vinyl chloride/vinyl acetate copolymer, vinyl chloride/vinylidene chloride copolymer, vinyl chloride/acrylonitrile copolymer, ethylene/vinyl alcohol copolymer, chlorinated polyvinyl chloride, ethylene/vinyl chloride copolymer, and ethylene/vinyl acetate copolymer; cellulose ester resins such as cellulose nitrate, cellulose acetate propionate, cellulose diacetate, cellulose triacetate, cellulose acetate phthalate, and cellulose acetate butyrate; copolymers of maleic acid or acrylic acid, copolymers of acrylic esters, acrylonitrile/styrene copolymer, chlorinated polyethylene, acrylonitrile/chlorinated ethylene/styrene copolymer, methyl methacrylate/butadiene/styrene copolymer, acryl resin, polyvinyl acetal resin, polyvinyl butyral resin, polyesterpolyurethane resin, polyetherpolyurethane resin, polycarbonatepolyurethane resin, polyester resin, polyether resin, polyamide resin, amino resin, rubber resins such as styrene/butadiene resin and butadiene/acrylonitrile resin, silicon resin, fluorine containing resin polymethyl methacrylate, and a copolymer of methyl methacrylate and methyl acrylate, but are not limited thereto. The cellulose ester resins such as cellulose diacetate and cellulose acetate propionate resin are preferable.

The back coating layer described above can provide a coefficient of dynamic friction of not more than 0.9.

The substrate used in the invention preferably has on the substrate a hardened resin layer formed by polymerizing a composition containing at least one ethylenically unsaturated compound has been polymerized and hardening.

As the hardened resin layer formed by polymerizing a composition containing an ethylenically unsaturated compound and hardening, a hardened layer formed by hardening an active ray hardenable resin or a heat-hardenable resin is preferably used, and an active ray hardenable resin layer is more preferably used.

The active ray hardenable resin layer herein referred to implies a layer containing, as a main component, a resin which capable of being hardened by irradiation of active rays such as UV light or electronic beam. Examples of the active ray hardenable resin include an ultraviolet (hereinafter referred to also as UV) ray hardenable resin or an electronic beam hardenable resin. The active ray hardenable resin may be a resin which can be hardened by active rays other than UV ray or electronic beam. The UV ray hardenable resins include a UV ray hardenable acrylurethane resin, a UV ray hardenable polyesteracrylate resin, a UV ray hardenable epoxyacrylate resin, a UV ray hardenable polyolacrylate resin and a UV ray hardenable epoxy resin. Examples thereof include trimethylolpropane triacrylate, ditrimethylolpropane tetraacrylate, pentaerythritol triacrylate, pentaerythritol tetraacrylate, dipentaerythritol hexaacrylate or alkyl-modified dipentaerythritol pentaacrylate.

The UV ray hardenable acrylurethane resins include those prepared easily by reacting a polyesterpolyol with an isocyanate monomer or its prepolymer and then reacting the resulting product with an acrylate having a hydroxy group such as 2-hydroxyethylacrylate, 2-hydroxyethylmethacrylate (hereinafter, acrylate also includes a methacrylate) or 2-hydroxypropylacrylate (disclosed for example, in Japanese Patent O.P.I. Publication No. 59-151110/1984).

The UV ray hardenable polyesteracrylate resins include those prepared easily by reacting a polyesterpolyol with 2-hydroxyethylacrylate or 2-hydroxypropylacrylate (disclosed for example, in Japanese Patent O.P.I. Publication No. 59-151110/1984).

Examples of the UV ray hardenable epoxyacrylate resin include those prepared by reacting an epoxyacrylate oligomer in the presence of a reactive diluting agent and a photoinitiator (disclosed for example, in Japanese Patent O.P.I. Publication No. 1-105738/1989).

The photoinitiators thereof include benzoine or its derivative, or acetophenones, benzophenones, hydroxy benzophenones, Michler's ketone, α-amyloxime esters, thioxanthones or their derivatives an oxime ketone derivative, a benzophenone derivative or a thioxanthone derivative. These photoinitiators may be used together with a photo-sensitizer. The above photoinitiators also work as a photo-sensitizer. Sensitizers such as n-butylamine, triethylamine and tri-n-butylphosphine can be used in photo-reaction of epoxyacrylates.

The polymerizable monomers having one unsaturated double bond in the molecule include methyl acrylate, ethyl acrylate, butyl acrylate, benzyl acrylate, cyclohexyl acrylate, vinyl acetate, and styrene. The polymerizable monomers having two unsaturated double bonds in the molecule include ethylene glycol diacrylate, propylene glycol diacrylate, divinylbenzene, 1,4-cyclohexane diacrylate, 1,4-cyclohexyldimethyl diacrylate, trimethylol propane triacrylate, and pentaerythritol tetraacrylate.

Ultraviolet ray hardenable resins, which are available on the market, include ADEKA OPTOMER KR-BY series: KR-400, KR-410, KR-550, KR-566, KR-567, or BY-320B (each produced by Asahi Denka Co., Ltd.); Koei Hard A-101-KK, A-101-WS, C-302, C-401-N, C-501, M-101, M-102, T-102, D-102, NS-101, FT-102Q8, MAG-1-P20, AG-106, or M-101-C, (each produced by Koei Kagaku Co., Ltd.); SEIKA BEAM PHC 2210 (S), PHC X-9 (K-3), PHC 2213, DP-10, DP-20, DP-30, P1000, P1100, P1200, P1300, P1400, P1500, P1600, or SCR 900 (each produced by Dainichi Seika Kogyo Co., Ltd.); KRM7033, KRM7039, KRM7130, KRM7131, UVCRYL29201, or UVCRYL29202 (each produced by Daicel-UCB Co., Ltd.); RC-5015, RC-5016, RC-5020, RC-5031, RC-5100, RC-5102, RC-5120, RC-5122, RC-5152, RC-5171, RC-5180, or RC-5181 (each produced by Dainippon Ink and Chemicals, Inc.); AUREX No. 340 Clear (produced by Chugoku Toryo Co., Ltd.); SANRAD H-601 (produced by Sanyo Chemical Industries, Ltd.); SP-1509 or SP-1507 (each produced by Showa Kobunshi Co., Ltd.); RCC-15C (produced by Grace Japan Co., Ltd.); and ARONIX M-6100, M-8030, or M-8060 (produced by To a Gosei Co., Ltd.).

The active ray hardenable layer used in the invention can be provided according to a conventional method. As a light source for hardening the UV ray hardenable layer by photo hardening reaction to form a hardened layer, any light source capable of emitting UV rays can be used. Examples of the light source include a low pressure mercury lamp, a medium pressure mercury lamp, a high pressure mercury lamp, a super-high pressure mercury lamp, a carbon arc lamp, a metal halide lamp, and a xenon lamp. Although the exposure amount is varied depending on the kinds of light source, it may be 20–10,000 mJ/cm$^2$, and is more preferably 50–2,000 mJ/cm$^2$. The sensitizer having an absorption maximum in the range of from near-ultraviolet to visible wavelength is effectively used.

The organic solvents for preparing a coating solution of a UV ray hardenable resin layer can be suitably selected from for example, hydrocarbons, alcohols, ketones, esters, glycols, other solvents or a mixture thereof. An organic solvent is preferably used which contains in an amount of preferably not more than 5% by weight and more preferably 5 to 80% by weight, propylene glycol monoalkyl (alkyl having 1 to 4 carbon atoms) ether or propylene glycol monoalkyl (alkyl having 1 to 4 carbon atoms) ether ester.

The coating solution of the ultraviolet ray hardenable resin composition can be coated through the coaters described above. The wet coating thickness is preferably 0.1 to 30 µm, and more preferably 0.5 to 15 µm.

The ultraviolet ray hardenable resin composition, while or after coating or drying, is irradiated with ultraviolet rays, and the irradiation time is preferably from 0.5 seconds to 5 minutes, and more preferably from 3 seconds to 3 minutes, in view of hardening efficiency or workability.

The hardened resin layer can contain inorganic or organic fine particles in order to prevent blocking or to increase anti-scratch resistance. The fine particles include those as denoted in the matting agent above. These particles have an average particle size of preferably from 0.005 to 1 µm, and more preferably from 0.01 to 0.1 µm.

The content of the particles in the ultraviolet ray hardenable resin composition is preferably 0.1 to 10 parts by weight based on the 100 parts by weight of ultraviolet ray hardenable resin composition.

The UV ray hardened resin layer may be a clear hard coat layer with a center-line surface roughness Ra of 1 to 50 nm, or an anti-glare layer with a center-line surface roughness Ra of 0.1 to 1 µm, the center-line surface roughness Ra being defined in JIS B0601. According to the invention, these resin layers can be subjected to plasma treatment to form a layer or layers on the surface thereof, and as described above, a uniform layer can be formed on the uneven surface of the substrate. The layer is preferably used as for example, an optical interference layer of a low reflection laminate comprised of a high refractive index layer, a medium refractive index layer or a low refractive index layer. The method according to the invention is preferable in that a uniform layer can be formed on the surface of an anti-glare layer with a center-line surface roughness Ra of 0.1 to 0.5 µm.

The substrate in the invention or the substrate in the invention having a coated layer thereon has a retardation $R_0$ in planes of preferably 0 to 1000 nm as an optical property, and a retardation $R_t$ in the thickness direction of preferably 0 to 300 nm as an optical property. Herein, $R_0$ (450) implies a retardation in planes based on the measurement of the three dimensional refractive indices measured through a 450 nm light, and $R_0$ (600) implies a retardation in planes based on the measurement of the three dimensional refractive indices measured through a 600 nm light.

The plasma discharge treatment at atmospheric pressure or at approximately atmospheric pressure in the method of the invention, whereby a layer or layers are formed, are carried out employing the following plasma discharge apparatus.

Regarding a layer or layers forming apparatus used in the method of the present invention, examples of the plasma discharge apparatus useful for the present invention will be shown below, but the present invention is not limited thereto.

Figure 1:
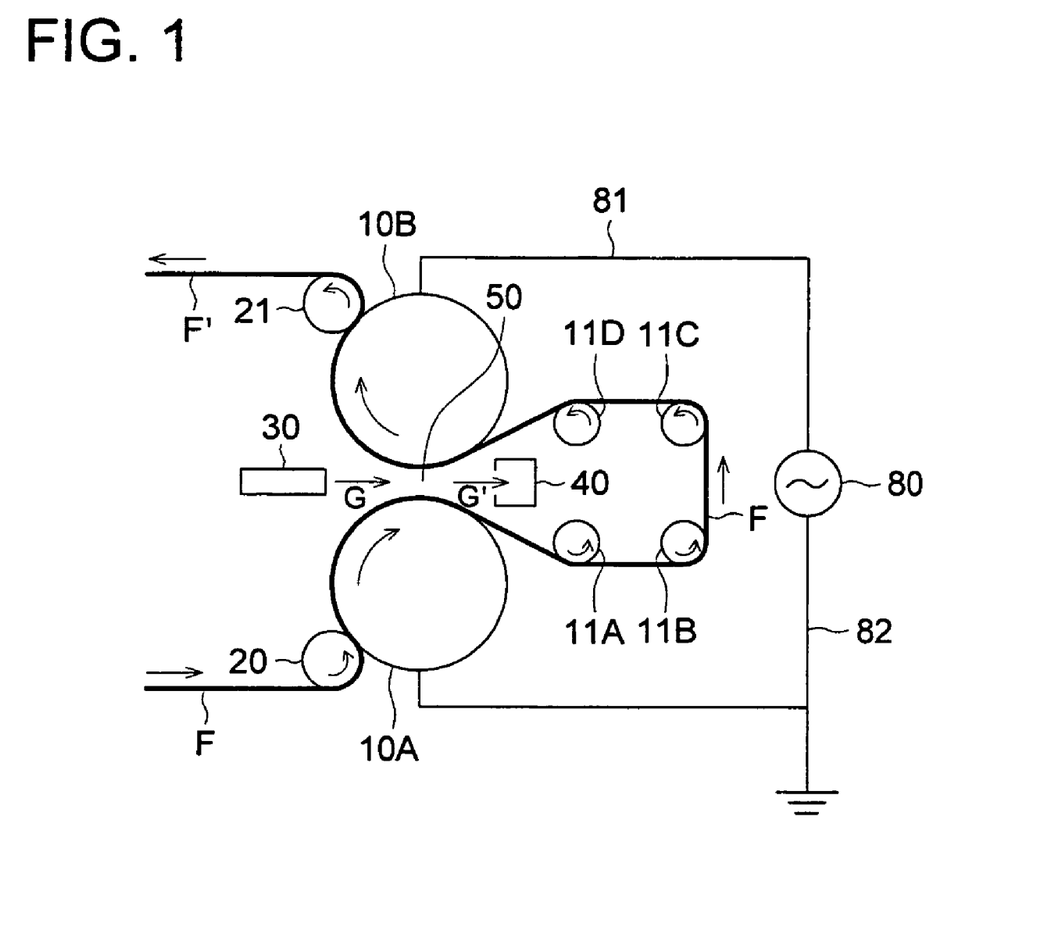
FIG. 1 shows a schematic drawing of one embodiment of a plasma discharge apparatus used in the layer forming method of the present invention.

FIG. 1 shows a schematic drawing of one embodiment of a plasma discharge apparatus used in the layer forming method of the present invention. In FIG. 1, the plasma discharge apparatus comprises a pair of rotating electrodes 10A and 10B being connected through voltage applying members 82 and 81, respectively, to a power supply 80. The rotating electrodes 10A and 10B transport a substrate, which are preferably in a roll form or in an endless belt form. The electrodes of FIG. 1 are roller electrodes. A gap formed between the paired electrodes is a space where discharge is carried out, and a substrate F can be introduced. The gap between the paired electrodes provides a discharge section 50. The gap is maintained at atmospheric pressure or at approximately atmospheric pressure. A reaction gas G is supplied from a reaction gas supply section 30 to the gap where the surface of a substrate F is subjected to plasma discharge treatment. The substrate F, unwound from a supply spool (not illustrated) or transported from the previous process, is transported through a guide roller 20 to the rotating electrode 10A rotating in the transporting direction to be in contact with it, and passes through the discharge section 50, whereby a layer or layers are formed on the surface of the substrate F. The substrate F delivered from the discharge section 50 is allowed to make a U-turn around U-turn rollers 11A, 11B, 11C and 11D, transported to the rotating electrode 10B to be in contact with it, which is rotating in the opposite direction of the rotating electrode 10A, and allowed to again pass through the discharge section 50, where the surface of the substrate F is further subjected to plasma discharge treatment, and another layer is again formed on the layer formed previously. The reaction gas G, which has been used for discharge treatment, is exhausted from a gas exhaust port 40 as waste gas G'. In FIG. 1, the formed layer is not illustrated. The substrate F' having a formed layer on the surface is transported to the next process or to an uptake spool (not illustrated) through a guide roller 21. Accordingly, the substrate reciprocates at the discharge section 50 in contact with the rotating electrodes 10A and 10B. Although not illustrated, the devices such as the rotating electrodes 10A and 10B, guide rollers 20 and 21, U-turn rollers 11A through 11D, the reaction gas supply section 30, and the gas exhaust port 40 are preferably accommodated in a discharge vessel whereby the devices are segregated from the outside. Although also not illustrated, the rotating electrodes 10A and 10B have a structure in which their temperature is adjusted by a circulated temperature-controlled medium.

Figure 2:
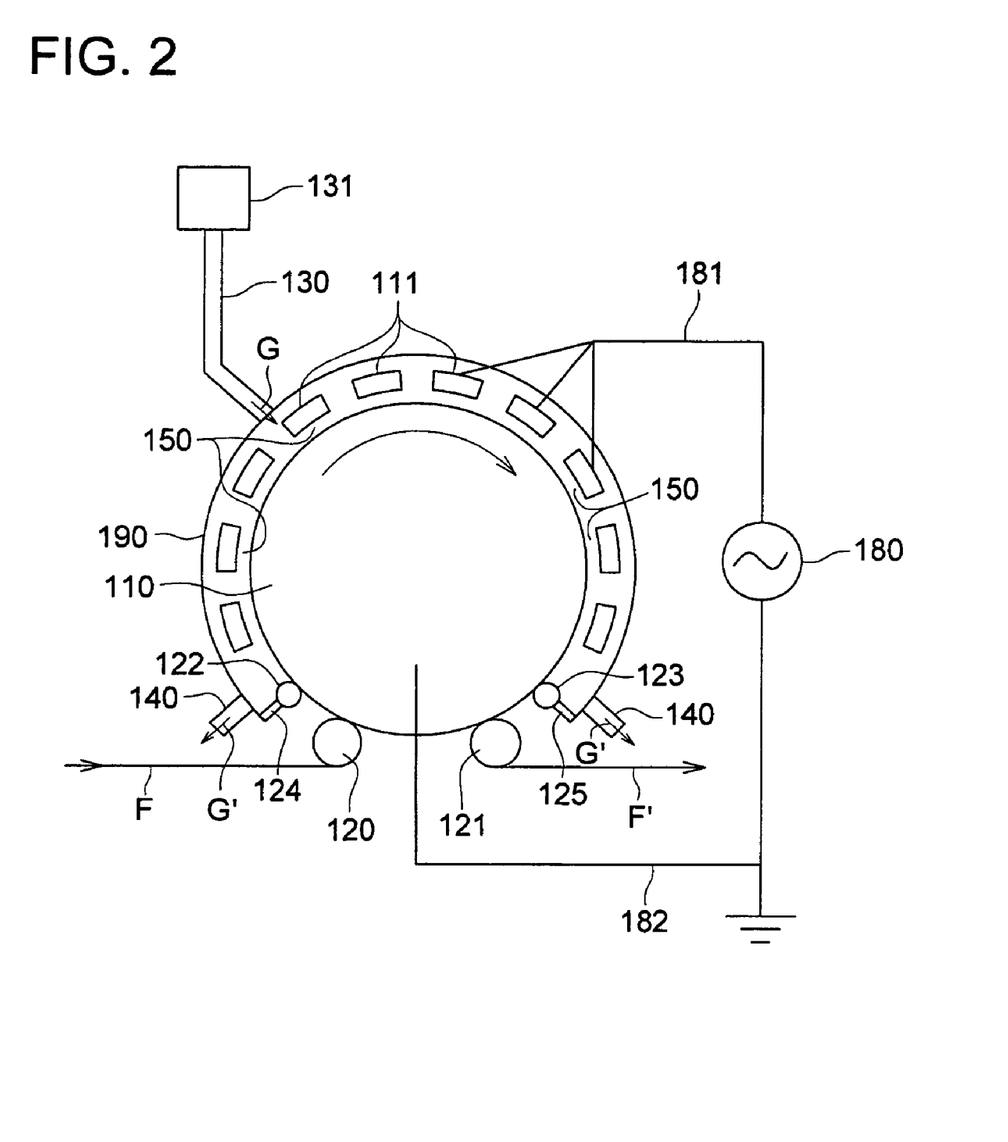
FIG. 2 shows a schematic drawing of one embodiment of a plasma discharge apparatus comprising a rotating electrode and a fixed electrode useful for the layer forming method of the invention.

FIG. 2 shows a schematic drawing of another embodiment of a plasma discharge apparatus. FIG. 2 shows one example of the plasma discharge apparatus comprising a rotating electrode and a fixed electrode useful for the layer forming method of the invention. In FIG. 2, the plasma discharge apparatus comprises a rotating electrode 110 and plural fixed electrodes 111 arranged to oppose the rotating electrode. A substrate F from a supply spool (not illustrated) or the previous process is transported to the rotating electrode through a guide roller 120 and a nip roller 122, and further transported in synchronism with the rotation of the rotating electrode 110 while contacting the rotating electrode 110. A reaction gas G generated in a gas generation device 131 is introduced through a gas supply pipe 130 into a plasma discharge section 150 at atmospheric pressure or at approximately atmospheric pressure where a layer or layers are formed on the substrate surface facing the fixed electrodes. The power supply 180, which is capable of applying voltage for plasma generation, is connected to the rotating electrode 110 and the fixed electrodes 111 through voltage applying members 181 and 182. The rotating electrode 110, the fixed electrodes 111 and the discharge section 150 are covered with a plasma discharge vessel 190 and segregated from the exterior. Waste gas G' is exhausted from a gas exhaust port 140 arranged at a lower portion of the discharge section. The substrate F' subjected to the plasma discharge treatment is transported to the next process or to an uptake spool (not illustrated) through a nip roller 123 and a guide roller 121. A Blade 124 is provided to contact the nip roller 122 arranged at the inlet of the substrate F in order to prevent air accompanied by substrate F from entering the discharge section, and a blade 125 is provided to contact the nip roller 123 arranged at the outlet of the substrate F' in order to prevent the reaction gas G or waste gas G' from escaping from the discharge section. Although not illustrated, the rotating electrode 110 and fixed electrodes 111 have a structure in which their temperature is adjusted by a circulated temperature-controlled medium.

As described above, it is preferable in the invention that the substrate is subjected to plasma discharge treatment while transporting the substrate in contact with the rotating electrode, whereby a layer or layers are formed on the substrate surface.

The surface of the rotating electrode, which is in contact with the substrate being transported, is required to have a high smoothness. The surface of the rotating electrode has a maximum surface roughness (Rmax) of preferably not more than 10 μm, more preferably not more than 8 μm, and most preferably not more than 7 μm. Herein, the maximum surface roughness refers to that in the surface roughness defined in JIS B 0601.

The surface of the electrodes used in the invention is preferably covered with a solid dielectric substance, and it is also preferable that a conductive base metal such as metal is covered with a solid dielectric substance. Examples of the solid dielectric substance include a plastic such as polytetrafluoroethylene or polyethylene terephthalate, a metal oxide such as glass, silicon dioxide, aluminum oxide ($Al_2O_3$), zirconium oxide ($ZrO_2$), titanium oxide ($TiO_2$), and a complex oxide such as barium titanate. It is especially preferable that the coverage is carried out by thermally spraying ceramic on the base metal, and sealing the ceramic layer with inorganic materials. Herein, examples of the conductive base metal such as metal include silver, platinum, stainless steel, aluminum, and iron, and of these, stainless steel is preferable in view of processability. Materials for lining include silicate glass, borate glass, phosphate glass, germanate glass, tellurite glass, aluminate glass, and vanadate glass. Among these, borate glass is preferably used in view of processability.

In the invention, the electrodes have a structure capable of being optionally heated or cooled with a heating or cooling source in the interior. When the electrodes are in the form of a belt, they can be cooled with cooled air from the rear side. When the electrodes are rotating electrodes in the form of roll, it is preferable that the outer surface temperature of the electrodes or the temperature of the substrate is controlled by supplying a medium to the interior of the electrodes. As the medium, insulating materials such as distilled water and oil are preferably used. Although the temperature, at which the substrate is treated, is different due to treatment conditions, it is preferably from room temperature to 200° C., and more preferably from room temperature to 120° C. It is necessary that the substrate be treated not to produce unevenness of the temperature of the substrate.

In the invention, the gap distance between the electrodes is determined in view of the thickness of the solid dielectric substance, applied voltage or frequency, or an object of employing plasma. In the opposing electrodes described above, when an electrode on only one side has a solid dielectric substance or electrodes on both sides thereof have solid dielectric substances, the minimum gap distance between the electrode and the dielectric substance in the former or the minimum gap distance between the dielectric substances in the latter is preferably from 0.5 to 20 mm, and more preferably 1±0.5 mm, in that uniform plasma is generated.

In the invention, a mixed gas generated in a gas generation device is introduced from a reaction gas supply port in a controlled amount into a plasma discharge section between the opposing electrodes. The concentration or amount of the reaction gas is adjusted as necessary, but the gas is preferably supplied to the discharge section at a rate sufficient to meet the transporting speed of the substrate. The gas supply amount or discharging conditions are preferably set to form a layer or layers employing substantially all the amount of the gas supplied to the discharge section.

In order to prevent ambient air from entering into a discharge section or to prevent the reaction gas from escaping from the discharge section, the electrodes and the transporting substrate are preferably segregated from the outside by being surrounded with a cover. In the invention, the pressure in the discharge section is maintained at atmospheric pressure or at approximately atmospheric pressure. Herein, the approximately atmospheric pressure herein referred to implies a pressure of 20 kPa to 110 kPa. In order to obtain the effects of the invention, the pressure is preferably 93 kPa to 110 kPa.

In the plasma discharge apparatus useful for the invention comprising electrodes opposing each other, it is preferable that in order to generate stable plasma, voltage is applied to the electrode on one side connected to the power supply to generate plasma, and the electrode on the other side is grounded.

Voltage applied to the electrodes by a high frequency power supply is properly determined. For example, the voltage may be 0.5 to 10 kV, the frequency applied may be 1 kHz to 150 MHz, and the wave shape may be a pulse shape or a sine curve shape. Particularly, a frequency of from less than 100 kHz to 50 MHz provides a preferable discharge section (discharge space).

The discharge density at the discharge section is preferably from 5 to 1000 W·min./m², and more preferably from 50 to 500 W·min./m².

The plasma discharge section is preferably covered with for example, a vessel of pyrex glass, but a vessel of metal may be used if insulation from the electrodes is secured. For example, the vessel may be a vessel of aluminum or stainless steel laminated with a polyimide resin or of aluminum or stainless steel thermally sprayed with ceramic to produce an insulation layer on the surface. The reaction gas is suitably supplied to the plasma discharge section or the waste gas is suitably exhausted by surrounding the sides of the discharge section, the rotating electrodes or the transporting section of the substrate with a protective material.

The reaction gas used in the method of the invention of forming a layer or layers will be explained below.

The reaction gas for forming a layer or layers according to the method of the invention preferably contains inert gas. That is, the reaction gas preferably contains a mixed gas of inert gas with a reactive gas described later. The inert gas herein referred to implies an element belonging to group XVIII in the periodic table, and is typically helium, neon, argon, krypton, xenon, or radon. In the invention, helium or argon is preferably used, and argon is more preferably used. The inert gas content of the reaction gas is preferably not less than 90% by volume, in obtaining a stable plasma, and more preferably from 90 to 99.99% by volume.

The inert gas is used for producing a stable plasma. The reaction gas is ionized or radicalized in the plasma, and is accumulated or adhered on the substrate to form a layer or layers on the substrate surface.

The reaction gas in the invention can contain various kinds of reactive gases, whereby a layer or layers having various functions can be formed on the surface of the substrate.

Employing for example, an organic fluorine-containing compound or a silicon compound as a reactive gas, a low refractive index layer of an anti-reflection layer can be formed. Further, employing an organometallic compound comprising. Ti, Zr, In, Sn, Zn, Ge, Si, or another metal, a metal oxide or metal nitride layer can be formed which functions as a medium or high refractive index layer of an anti-reflection layer, a conductive layer or an anti-static layer. Employing an organic fluorine-containing compound, an anti-stain layer or a low refractive index layer can be formed, and employing a silicon compound, a gas barrier layer or a low refractive index layer can be formed. The method according to the invention is especially preferably used in order to prepare an anti-reflection layer which is a multiple layer prepared by laminating a high or medium refractive index layer and a low refractive index layer alternately.

The thickness of the layer formed according to the invention is preferably in the range of 1 nm to 1000 nm.

When the layer in the invention is formed on the surface of the substrate described above according to the invention, the thickness of the layer is provided on the substrate surface so that the thickness deviation from the average thickness falls within the range of preferably ±8%, more preferably ±5%, and still more preferably ±1%.

As the organic fluorine-containing compound used in the reactive gas useful for the invention, a fluorocarbon gas or a fluorohydrocarbon gas is preferably used. Examples of the organic fluorine-containing compound include a fluorocarbon compound such as tetrafluorocarbon, hexafluorocarbon, tetrafluoroethylene, hexafluoropropylene, or octafluorocyclobutane; a fluorohydrocarbon compound such as difluoromethane, tetrafluoroethane, tetrafluoropropylene, trifluoropropylene or octafluorocyclobutane; a halide compound of a fluorohydrocarbon compound such as monochlorotrifluoromethane, monochlorodifluoromethane, or dichlorotetrafluorobutane; and fluorinated compounds of alcohols, acids or ketones. These compounds may be used singly or as a mixture of two or more kinds thereof. Examples of the fluorohydrocarbon gas include difluoromethane, tetrafluoroethane, tetrafluoropropylene, and trifluoropropylene, and further include a halide compound of a fluorohydrocarbon compound such as monochlorotrifluoromethane, monochlorodifluoromethane, or dichlorotetrafluorobutane and fluorinated compounds of alcohols, acids or ketones, but are not limited thereto. These compounds may have an ethylenically unsaturated group in the molecule. These compounds may be used singly or as a mixture of two or more kinds thereof. When the organic fluorine-containing compound is used in the reaction gas useful for the invention, the content of the organic fluorine-containing compound in the reaction gas is preferably 0.01 to 10% by volume, and more preferably 0.1 to 5% by volume, in that a uniform layer is formed on the substrate by the plasma discharge treatment.

When the organic fluorine-containing compound in the invention is gas at ordinary temperature and ordinary pressure, it can be used as it is in the reaction gas, wherein the method of the invention can be carried out most easily. When the organic fluorine-containing compound in the invention is liquid or solid at ordinary temperature and ordinary pressure, it may be used as gas, in which it is gasificated by heating or under reduced pressure, or in the form of solution, in which it is dissolved in an appropriate solvent.

As the silicon compound for the reactive gas useful for the invention, for example, an organometallic compound such as dimethylsilane or tetramethylsilane; a metallic hydride such as monosialne or disilane; a metal halide such as dichlorosilane, trichlorosilane or silicon tetrafluoride, an alkoxysilane such as tetramethoxysilane, tetraethoxysilane, tetrapropoxysilane, dimethyldiethoxysilane, methyltrimethoxysilane or ethyltriethoxysilane; or an organosilane is preferably used, but is not limited thereto. Another compound may be added to the reaction gas to modify or control layer properties. When the above silicon compound as the reactive gas is used in the reaction gas, the content of the silicon compound in the reaction gas is preferably 0.01 to 10% by volume, and more preferably 0.1 to 5% by volume, in that a uniform layer is formed on the substrate by the plasma discharge treatment.

The organometallic compounds as the reactive gas useful for the invention are not specifically limited, but include a compound of metal such as Al, As, Au, B, Bi, Sb, Ca, Cd, Cr, Co, Cu, Fe, Ga, Ge, Hg, In, Li, Mg, Mn, Mo, Na, Ni, Pb, Pt, Rh, Se, Si, Sn, Ti, Zr, Y, V, W, or Zn, which are preferably used. In order to form a high refractive index layer as an antireflection layer, the titanium compound is preferably used. As the above described titanium compound, for example, an organometallic amino compound such as tetradimethylamino titanium, a metallic hydride such as titanium tetrahydride or dititanium hexahydride, a metal halide such as titanium dichloride, titanium trichloride or titanium tetrachloride, or a metal alkoxide such as titanium tetraethoxide, titanium tetrapropoxide or titanium tetrabutoxide is preferably used. The titanium compound used in the invention is not limited thereto. As the silicon compound or organometallic compound, a metal hydride compound or a metal alkoxide compound is preferably used in view of handling, and the metal alkoxide compound is more preferably used, since it is not corrosive and does not generate harmful gas. When the organometallic compound is used in the reaction gas useful for the invention, the content of the organometallic compound in the reaction gas is preferably 0.01 to 10% by volume, and more preferably 0.1 to 5% by volume, in that a uniform layer is formed on the substrate by the plasma discharge treatment.

When the silicon compound or titanium compound is introduced into the discharge section, it may be any of gas, liquid or solid at ordinary temperature and ordinary pressure. When it is gas at ordinary temperature and ordinary pressure, it can be used as it is, and when it is liquid or solid at ordinary temperature and ordinary pressure, it can be used as gas, in which it is gasified by heating, under reduced pressure or ultrasonic wave application. When the silicon compound or titanium compound is gasified by heating, and used, a metal alkoxide such as tetraethoxysilane or titanium tetraisopropoxide, which has a boiling point at ordinary-temperature or ordinary pressure of not more than 200° C., is suitably used in order to form a layer or layers of a low reflection laminate. The above metal alkoxide may be diluted with another organic solvent. The solvents include an organic solvent such as methanol, ethanol, n-hexane or a mixture thereof.

The reaction gas further containing hydrogen in an amount of 0.1 to 10% by volume can markedly increase hardness of the layer formed on the substrate.

Examples of the optical film of the invention include, for example, an optical film in which a low refractive index layer and a high refractive index layer are laminated to form an anti-reflection layer or an optical film in which a conductive layer or an anti-static layer is formed.

In the invention, a multiple layer can be continuously formed on a substrate employing plural plasma discharging apparatuses in the invention, whereby an optical film can be obtained, which has a multiple layer without unevenness. For example, when an optical film is prepared which has an anti-reflection layer on a substrate, a high refractive index layer with a refractive index of 1.6 to 2.3 and a low refractive index layer with a refractive index of 1.3 to 1.5 are continuously and effectively provided on a substrate. The low refractive index layer is preferably a fluorine-containing compound-containing layer formed by plasma discharging in the gas containing a fluorine-containing compound, or a silicon dioxide-containing layer formed by plasma discharging in the gas containing an organic silicon compound such as an alkoxysilane. The high refractive index layer is preferably a metal oxide-containing layer formed by plasma discharging in the gas containing an organometallic compound, for example, a titanium oxide-containing layer or a zirconium oxide-containing layer. The layer in the invention is not limited to these layers, and the structure of the layer is not limited to that of these layers. For example, the outermost layer can be subjected to plasma discharging treatment under atmospheric pressure or approximately atmospheric pressure in the presence of a reaction gas containing a fluorine-containing organic compound gas to form an anti-stain layer.

The method of the invention can form a multiple layer without unevenness and provide an optical film with a uniform layer. Thus, the present invention can provide an optical film with a layer or layers having various functions.

An anti-static layer or conductive layer may be a layer with a thickness of 0.1 to 2 µm comprising metal oxide fine particles or conductive fine particles of a cross-linkable cationic polymer, or a conductive substance-containing layer comprising a metal oxide such as tin oxide or zinc oxide produced by plasma discharging treatment at atmospheric pressure or at approximately atmospheric pressure.

The optical film of the invention is useful especially for a polarizing plate protective film, and a polarizing plate can be prepared according to a conventional method employing the optical film. The optical film has a layer or layers with high uniformity and is preferably applied to various image displays which provide excellent displaying properties.

EXAMPLES

The invention will be detailed according to the following examples, but is not limited thereto.

Example 1

This example 1 relates to items 4, 6, 7, and 8.

| Preparation of Dope A (Dope composition A) | |
|---|---|
| Methylene chloride | 370 kg |
| Ethanol | 70 kg |
| Cellulose acetate propionate (acetyl substitution degree: 2.0, propionyl substitution degree: 0.8) | 100 kg |
| Ethylphthalylethylglycolate | 7 kg |
| TINUVIN 326 | 1 kg |

The acyl substitution degree of the cellulose ester was measured according to the method as defined in ASTM-D817-96.

The organic solvents of the above dope composition A was incorporated in a sealed vessel, added with the other components, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain Dope A.

Preparation of Cellulose Acetate Propionate Film

A cellulose acetate propionate film was prepared according to a solution cast film manufacturing method. Dope A was uniformly cast at a dope temperature of 35° C. on a 30° C. endless stainless steel belt support to form a web. The web was dried until it could be peeled from the support, and then was peeled from the stainless steel belt support. At peeling, the residual solvent amount of the web was 35% by weight. The peeled web was dried at 90° C. in a tenter while being stretched in the transverse direction by a stretching magnification as shown in Table 1, and further dried in a dry zone of 120° C. while transported by rollers. Thus, cellulose ester films 1 and 2 each having a thickness of 70 µm, a width of 1.3 m, and a length of 2000 m were prepared, and designated as substrate samples 1 and 2, respectively. Cellulose ester film 1C was prepared in the same manner as in cellulose ester film 1, except that stretching was not carried out, and was designated as substrate sample 1C.

Preparation of Optical Film

Employing the plasma discharge apparatus shown in FIG. 2, a thin titanium oxide layer (a high refractive index layer) was formed on substrate samples 1, 2 and 1C. Thus, optical film samples 1, 2 and 1C were obtained.

As a rotating electrode, a roll electrode with a solid dielectric substance was prepared, in which a stainless steel jacket roll base metal having the function of adjusting temperature by circulated water was covered with a 1 mm thick alumina layer by means of thermal spraying of ceramic, coated with an organic solvent solution of tetramethoxysilane, dried, hardened by irradiation of ultraviolet rays to carry out sealing treatment, and further subjected to vertical specular polish for finish. A fixed electrode with a solid dielectric substance was prepared in the same manner as in the roll electrode above. The roll electrode and fixed electrode were arranged as shown in FIG. 2. The gap between both electrodes was 1.5 mm±0.1 mm. The power supply used to generate discharge plasma was a high frequency power supply JRF-1000 produced by Nihon Denshi Co. Ltd. Plasma discharge treatment was carried out at 13.56 MHz and at a discharge density of 300 W·min/m². The rotating electrode was rotated by means of a driving device, and the circumferential speed thereof was synchronized with the transporting speed of the substrate sample.

Employing the following reaction gas composition for forming a high refractive index layer, optical film samples 1, 2 and 1C having a thin titanium oxide layer were continuously prepared from substrate samples 1, 2 and 1C, respectively.

The evaluation results thereof are shown in Table 1.

| (Composition for forming a high refractive index layer) | |
|---|---|
| Inert gas: argon | 99.4% by volume |
| Reactive gas: tetraisopropoxytitanium vapor(150° C. liquid was bubbled with argon gas) | 0.1% by volume |
| Hydrogen gas | 0.5% by volume |

(Visual Obeservation Evaluaton)

The samples were cut into a width of 1.3 m and a length of 50 cm, and the rear surface thereof was subjected to light absorbing treatment employing a black spray to form a light absorption layer. Reflection of light of a fluorescent lamp from the surface of the samples opposite the light absorption layer was visually observed, and evaluated for unevenness of the layer according to the following criteria:
A: No unevenness was observed.
B: Slight unevenness was observed.
C: Unevenness was observed.
D: Apparent unevenness was observed.

TABLE 1

| | Optical film sample No. | Substrate sample No. used | Stretching magnification | Unevenness (Visual observation) |
|---|---|---|---|---|
| Example 1 | 1 | 1 | 1.05 | B |
| | 2 | 2 | 1.10 | A |
| | 1C | 1C | — | D |

(Results)

It has been confirmed that the method according to the invention forms a layer or layers with reduced film unevenness.

Example 2

This example 2 relates to items 2, 6, 7, and 8.

| Preparation of Dope B (Dope composition B) | |
|---|---|
| Methylene chloride | 380 kg |
| Ethanol | 40 kg |

| -continued | |
|---|---|
| Preparation of Dope B (Dope composition B) | |
| Cellulose triacetate (acetyl substitution degree: 2.92) | 100 kg |
| Triphenyl phosphate | 11 kg |
| Silicon dioxide particles (particle size: 0.01 μm) | 0.12 kg |
| TINUVIN 326 | 1 kg |

The organic solvents of the above dope composition B was incorporated in a sealed vessel, added with the other components, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain Dope B.

Preparation of Cellulose Triacetate Film

A cellulose triacetate film was prepared according to a solution cast film manufacturing method. Dope B was uniformly cast at a dope temperature of 35° C. on a 25° C. endless stainless steel belt support to form a web. The web was dried until it could be peeled from the support, and then was peeled from the stainless steel belt support. At peeling, the residual solvent amount of the web was 70% by weight. The peeled web was dried at 90° C. in a tenter while being stretched in the transverse direction by a stretching magnification of 1.03 and 1.10, and further dried in a dry zone of 120° C. while transported by rollers. Thus, cellulose ester films 3 and 4 each having a thickness of 60 μm were prepared, and designated as substrate samples 3 (stretched at a stretching magnification of 1.03) and 4 (stretched at a stretching magnification of 1.10), respectively. Cellulose ester film 3C was prepared in the same manner as in cellulose ester film 3, except that at peeling of the web, the residual solvent amount of the web was 20% by weight, and was designated as substrate sample 3C.

Preparation of an Optical Film

Employing the plasma discharge apparatus shown in FIG. 2, a thin titanium oxide layer (a high refractive index layer) was formed on substrate samples 3, 4 and 3C in a similar manner as in Example 1. Thus, optical film samples 3, 4 and 3C having a thin titanium oxide layer were prepared from substrate samples 3, 4 and 3C, respectively.

The evaluation results thereof are shown in Table 2.

(Measurement of Tensile Strength)

Tensile strength was measured according to a method as defined in JIS K7127-1989. The tensile strength of the substrate sample obtained above was measured employing a tensile tester TENSILON RTA-100 produced by Olyentech Co., Ltd., provided that a substrate cut to the same size as specimen No. 1 as described in this JIS was pulled at a tensile speed of 100 mm/min. The measurement was made with respect to the mechanical direction (MD direction) and the transverse direction (TD direction) of the substrate sample.

(Evaluation of Variation of Layer Thickness in the TD Direction)

Optical film samples 3 and 4 formed a uniform layer without unevenness, as compared with optical film sample 3C.

The spectral reflectance of the high refractive index layer was measured under the condition of a 5° regular reflection through a spectrophotometer TYPE U-4000 (produced by Hitachi Seisakusho Co., Ltd.). In order to prevent light reflection at the rear surface of the substrate sample opposite the viewer side, the rear surface of the sample was surface-roughened, and subjected to light absorbing treatment employing a black spray to form a light absorption layer. Reflectance of the resulting sample was measured employing light with a wavelength of from 400 nm through 700 nm. The thickness of the high refractive index layer was computed from the reflection spectrum obtained above. The thickness of each of ten points in the TD direction on the high refractive index layer at an interval of 10 cm was measured, and the average of the layer thickness and deviation from the average in the TD direction were determined.

(Visual Observation Evaluation of Wrinkle Unevenness)

The samples were cut into a width of 1.3 m and a length of 50 cm, and subsequently, the rear surface thereof was subjected to light absorbing treatment employing a black spray to form a light absorption layer. Reflection of light of a fluorescent lamp from the surface of the samples opposite the light absorption layer was visually observed, and evaluated for wrinkle-like unevenness according to the following criteria:
A: No wrinkle-like unevenness was observed.
B: Slight wrinkle-like unevenness was observed.
C: Wrinkle-like unevenness was partly observed.
D: Apparent wrinkle-like unevenness was observed.

TABLE 2

| Optical film sample No. | Substrate sample No. | Tensile strength (N/mm²) MD/TD | *Average of layer thickness (Deviation) (nm) | Wrinkle-like unevenness (Visual observation) |
|---|---|---|---|---|
| Example 2 3 | 3 | 150/151 | 80 (±2) | B |
| 4 | 4 | 160/157 | 80 (±1) | A |
| 3C | 3C | 130/125 | 80 (±10) | D |

Symbol "*" represents the average layer thickness in the TD direction of the high refractive index layer and a deviation from the average.
A: No wrinkle-like unevenness was observed.
B: Slight wrinkle-like unevenness was observed.
C: Wrinkle-like unevenness was partly observed.
D: Apparent wrinkle-like unevenness was observed.

(Results)

It has been proved that the optical film samples 3 and 4 in the invention had a tensile strength of not less than $1.4 \times 10^2$ N/mm², produced no wrinkle-like unevenness, and minimized variation of layer thickness, judging from the measurement of spectral reflectance.

Example 3

This example 3 relates to items 3, 6, 7, and 8.

| Preparation of Dope C (Dope composition C) | |
|---|---|
| Methylene chloride | 440 kg |
| Ethanol | 35 kg |
| Cellulose triacetate (acetyl substitution degree: 2.86) | 100 kg |
| Ethylphthalylethyl glycolate | 15 kg |
| TINUVIN 326 | 0.5 kg |
| TINUVIN 109 | 0.5 kg |

The organic solvents of the above dope composition C was incorporated in a sealed vessel, added with the other components, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain Dope C.

Preparation of Cellulose Triacetate Film

A cellulose triacetate film was prepared according to a solution cast film manufacturing method. Dope C was uniformly cast at a dope temperature of 35° C. on a 30° C. stainless steel belt support to form a web. The web was dried until it could be peeled from the support, and then was peeled from the stainless steel belt support. At peeling, the residual solvent amount of the web was 40% by weight.

The peeled web was dried at 90° C. in a tenter while being stretched in the transverse direction by a stretching magnification of 1.05, and further dried in a dry zone of 120° C. while transported by rollers. Thus, cellulose ester film 5 having a thickness of 50 µm was prepared, and designated as substrate sample 5. Cellulose ester film 5C was prepared in the same manner as in cellulose ester film 5, except that Dope C contained 4 kg of ethylphthalylethyl glycolate instead of 15 kg of ethylphthalylethyl glycolate, and was designated as substrate sample 5C.

Preparation of an Optical Film

Employing the plasma discharge apparatus shown in FIG. 2, a thin titanium oxide layer (a high refractive index layer) was formed on substrate samples 5 and 5C in a similar manner as in Example 1. Thus, optical film samples 5 and 5C having a thin titanium oxide layer was prepared from substrate samples 5 and 5C, respectively.

The evaluation results thereof are shown in Table 3.

(Visual Observation Evaluation)

The optical samples 5 and 5C were processed and evaluated for unevenness of the layer in the same manner as in Example 1.

(Haze)

Haze was measured according to JIS K7105.

(Measurement of Moisture Content)

The substrate sample was cut into a size of 10 cm×10 cm, allowed to stand at 23° C. and 80% RH for 48 hours, and weighed. The weight of the resulting sample was $W_2$. Subsequently, this sample was dried at 120° C. for 45 minutes, and weighed, and the weight thereof was $W_1$. The moisture content of the sample was obtained from the following formula:

$$\text{Moisture content (\%)} = \{(W_2 - W_1)/W_1\} \times 100$$

TABLE 3

| Optical film sample No. | Substrate sample No. | Moisture content (%) | Haze (%) | Unevenness (Visual observation) |
|---|---|---|---|---|
| Example 3 5 | 5 | 3.0 | 0.0 | B |
| 5C | 5C | 4.1 | 0.3 | C |

It has been proved that the optical film sample 5 employing cellulose ester film sample 5 (substrate 5) having a moisture content of 3.0% by weight of the invention provides a low haze, and reduced unevenness, as compared with optical film sample 5C.

Example 4

This example 4 relates to items 1, 5, 6, 7, and 8.

| Preparation of dope D (Dope composition D) | |
|---|---|
| Ethanol | 35 kg |
| AEROSIL 200V | 0.3 kg |
| Methylene chloride | 440 kg |
| Cellulose triacetate (acetyl substitution degree: 2.89) | 100 kg |
| Triphenyl phosphate | 10 kg |
| Ethylphthalylethyl glycolate | 5 kg |
| TINUVIN 326 | 0.5 kg |
| TINUVIN 109 | 0.5 kg |

The organic solvents of the above dope composition D was incorporated in a sealed vessel, added with the other components, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain dope D.

Preparation of Cellulose Triacetate Film

A cellulose triacetate film was prepared according to a solution cast film manufacturing method. Dope D was uniformly cast at a dope temperature of 35° C. on a 30° C. stainless steel belt support to form a web. The web was dried until it could be peeled from the support, and then was peeled from the stainless steel belt support. At peeling, the residual solvent amount of the web was 40% by weight.

The peeled web was dried at 85° C. in a tenter while being stretched in the transverse direction by a stretching magnification of 1.06, and further dried in a dry zone of 120° C. while transported by rollers. Thus, cellulose ester film 6 having a thickness of 50 μm and containing a matting agent (AEROSIL 200V) was prepared, and designated as substrate sample 6. Tensile strengths with respect to the mechanical direction (MD direction) and the transverse direction (TD direction) of the sample were both not less than 150 N/mm². In the above preparation of the cellulose ester film 6, the surface of the cellulose ester film facing the stainless steel belt surface was designated as surface B, and the surface of the film opposite the surface B was designated as surface A. Cellulose ester film 6C was prepared in the same manner as in cellulose ester film 6, except that Dope D did not contain AEROSIL 200V, and was designated as substrate sample 6C.

Preparation of Substrate Sample Coated with a Layer such as a Back Coating Layer The following coating composition (1) was extrusion coated on the surface A of substrate sample 6 to give a wet thickness of 13 μm, and dried at 80° C. to form a back coating layer. The following coating composition (2) was extrusion coated on the surface B of substrate sample 6 to give a wet thickness of 13 μm, dried in a drying zone of 80° C., and subjected to ultraviolet light irradiation at 110 mJ/cm² to form a clear hard coating layer with a dry thickness of 3 μm and a center line average surface roughness ($R_a$) of 12 nm. Thus, substrate sample 7 was obtained.

Substrate sample 8 was prepared in the same manner as in substrate sample 7, except that the following coating composition (3) was used instead of coating composition (2) to form an anti-glare layer with a dry thickness of 3 μm.

The coating compositions (1), (2), and (3) used in the preparation of the above substrate samples 7 and 8 and the preparation method of coating composition (3) are shown below.

| {Coating composition (1) (Back coating layer coating composition)} | |
|---|---|
| Acetone | 30 parts by weight |
| Ethyl acetate | 45 parts by weight |
| Isopropyl alcohol | 10 parts by weight |
| Cellulose diacetate | 0.6 parts by weight |
| 2% Silicon dioxide particle acetone dispersion | 0.04 parts by weight |

| {Coating composition (2) (Clear hard coating layer coating composition)} | |
|---|---|
| Dipentaerythritol hexacrylate monomer | 60 parts by weight |
| Dipentaerythritol hexacrylate dimmer | 20 parts by weight |
| Dipentaerythritol hexacrylate trimer or its polymer higher than the trimer | 20 parts by weight |
| Diethoxybenzophenone | 4 parts by weight |
| Ethyl acetate | 45 parts by weight |
| Methyl ethyl ketone | 45 parts by weight |
| Isopropyl alcohol | 60 parts by weight |

Preparation of Coating composition (3)
(Anti-glare coating layer coating composition)

| | |
|---|---|
| Ethyl acetate | 45 parts by weight |
| Methyl ethyl ketone | 45 parts by weight |
| Isopropyl alcohol | 60 parts by weight |
| Silycia 431 (average particle size: 2.5 μm, produced by Fuji Silysia Chemical Co., Ltd.) | 2 parts by weight |
| AEROSIL 200V (average particle size: 12 nm) | 5 parts by weight |

The above composition was stirred in a high speed stirrer TK Homomixer, (produced by Tokushu Kika Kogyo Co., Ltd.) and further dispersed in a collision type disperser Mantongorin (produced by Gorin Co., Ltd.), and then added with the following UV hardenable solution to obtain a coating composition (3).

| (UV hardenable solution) | |
|---|---|
| Dipentaerythritol hexacrylate monomer | 60 parts by weight |
| Dipentaerythritol hexacrylate dimmer | 20 parts by weight |
| Dipentaerythritol hexacrylate trimer or its polymer higher than the trimer | 20 parts by weight |
| Diethoxybenzophenone | 4 parts by weight |

Preparation of an Optical Film

Employing a plasma discharge apparatus shown in FIG. 2, a titanium oxide layer (a high refractive index layer) was formed on the surface B of substrate samples 6 and 6C, on the clear hard coat layer of substrate sample 7, and on the anti-glare layer of substrate sample 8 in a similar manner as in Example 1. Thus, optical film samples 6, 6C, 7, and 8 were prepared from substrate samples 6, 6C, 7, and 8, respectively.

The resulting samples were evaluated according to the following methods. The results are shown in Table 4.

(Measurement of Coefficient of Dynamic Friction)

The resulting substrate sample was cut to a size of 100 mm×200 mm to obtain a first piece, and to a size of 750 mm×100 mm to obtain a second piece. The second piece was superposed on the first piece so that the outermost surfaces on the opposite side of the layer to be formed (the rear surfaces of the substrate sample 6 or the back coating layers of the substrate sample 7 or 8) contact each other, and the resulting composite was placed on a fixed horizontal plate. A foamed rubber-covered load with a weight of 200 g was put on the resulting material, adhered to the upper piece, and pulled with a force F in the horizontal direction. Force F (kg), with which the load begins moving, was measured, and coefficient of dynamic friction (μ) was obtained from the following formula:

$$F = \mu \times W$$

wherein W (kg) represents weight of the load, and F (kg) represents force with which the load begins moving.

Evaluation of Variation of Layer Thickness in the MD Direction

The spectral reflectance of the high refractive index layer was measured under the condition of a 5° regular reflection through a spectrophotometer TYPE U-4000 (produced by Hitachi Seisakusho Co., Ltd.). In order to prevent light reflection at the rear surface of the substrate samples opposite the viewer side, the rear surface of the sample was surface-roughened, and subjected to light absorbing treatment employing a black spray to form a light absorption layer. Reflectance of the resulting sample was measured employing light with a wavelength of from 400 nm to 700 nm. The thickness of the high refractive index layer was computed from the reflection spectrum obtained above. Layer thickness of each of ten points in the MD direction on the high refractive index layer at an interval of 30 cm was measured, and the average of the layer thickness and deviation from the average were determined.

TABLE 4

|  | Optical film sample No. | Substrate sample No. | Back coating layer (Surface A) | Clear hard coat layer (Surface B) | Anti-glare layer (Surface B) | Coefficient of dynamic friction | *Average of layer thickness in the MD direction (Deviation) (nm) |
|---|---|---|---|---|---|---|---|
| Example 4 | 6 | 6 | No | Yes | No | 0.7 | 80 (± 5) |
|  | 7 | 7 | Yes | Yes | No | 0.4 | 80 (± 2) |
|  | 8 | 8 | Yes | No | Yes | 0.4 | 80 (± 2) |
|  | 6C | 6C | No | Yes | No | 1.10 | 80 (± 10) |

Symbol "*" represents the average layer thickness in the MD direction of the high refractive index layer and a deviation from the average.

(Results)

The substrate sample 6 itself contained a matting agent. The substrate sample 7 had a matting agent-containing back coating layer on the surface A and a clear hard coating layer on the other surface B. The substrate sample 8 had a matting agent-containing back coating layer on the surface A and an anti-glare layer on the other surface B. Each of the substrate samples 6, 7, and 8 had a coefficient of dynamic friction of not more than 0.9. The substrate samples 6, 7, and 8 were subjected to plasma discharge treatment to obtain optical film samples 6, 7 and 8, respectively. The resulting optical film samples 6, 7 and 8 provided uniform layer thickness without variation of layer thickness in the MD direction.

Comparative Example 1

| Preparation of Dope E (Dope composition E) | |
|---|---|
| Methylene chloride | 440 kg |
| Ethanol | 35 kg |

| -continued | |
|---|---|
| Preparation of Dope E (Dope composition E) | |
| Cellulose triacetate (acetyl substitution degree: 2.86) | 100 kg |
| Triphenyl phosphate | 8 kg |
| TINUVIN 326 | 0.5 kg |
| TINUVIN 328 | 0.5 kg |

The organic solvents of the above dope composition E was incorporated in a sealed vessel, added with the other components, and stirred while heating to obtain a solution. The resulting solution was cooled to a temperature to be cast on a support, allowed to stand overnight, defoamed, and filtered employing an Azumi Roshi No. 244 produced by Azumi Roshi Co., Ltd. to obtain Dope E.

Preparation of Cellulose Triacetate Film

A cellulose triacetate film was prepared according to a solution cast film manufacturing method. Dope E was uniformly cast at a dope temperature of 35° C. on a 30° C. endless stainless steel belt support to form a web. The web was dried until it could be peeled from the support, and then was peeled from the stainless steel belt support. At peeling, the residual solvent amount of the web was 20% by weight. The peeled web was dried in a dry zone of from 90 to 120° C. while transported by rollers. Thus, cellulose ester film 7 having a thickness of 70 μm, and designated as substrate sample 9.

Preparation of an Optical Film

Employing a plasma discharge apparatus shown in FIG. 2, a thin titanium oxide layer (a high refractive index layer) was formed on substrate sample 9 in a similar manner as in Example 1. Thus, optical film sample 9 having a thin titanium oxide layer was prepared from substrate sample 9.

The resulting substrate sample was evaluated according to the followings and the results are shown in Table 5.

(Evaluation)

Visual observation evaluation for unevenness of the layer was carried out in the same manner as in Example 1, tensile strength and variation of layer thickness in the TD direction were measured and wrinkle unevenness was observed in the same manner as in Example 2, haze and moisture content were obtained in the same manner as in Example 3, and coefficient of dynamic friction and variation of layer thickness in the MD direction were measured in the same manner as in Example 4. The results are shown in Table 5.

TABLE 5

| Optical film sample No. | Substrate sample No. | Coefficient of dynamic friction | Tensile strength MD/TD (N/mm$^2$) | Haze (%) | Moisture content (%) | Visual observation | | *Average of layer thickness (Deviation) (nm) | |
|---|---|---|---|---|---|---|---|---|---|
| | | | | | | Wrinkle-like unevenness | Unevenness | MD | TD |
| Comparative example 1 | 9 | 9 | 1.10 | 130/122 | 0.3 | 5 | D | D | 80 (±10) | 80 (±13) |

Symbol "*" represents the average layer thickness in the MD and TD directions of the high refractive index layer and a deviation from the average.

As is apparent from Table 7, Optical film sample No. 9 (comparative), which employed an unstretched cellulose ester film, had a thickness of 70 µm, and had a tensile strength of 1.3×10$^2$ N/mm$^2$, a moisture content of 5% by weight, and a coefficient of dynamic friction of 1.10, falling outside the scope of the invention, provided apparent unevenness and a great variation of layer thickness.

Example 5 and Comparative Example 2

Optical film samples 7 and 8 of example 4, and optical film sample 9 of comparative example 1 were subjected to plasma discharge treatment to form a low refractive index layer (with a layer thickness of 95 nm and a refractive index of 1.46) on the high refractive index layer in the same manner as in Example 1, except that the following reaction gas composition for forming a low refractive index layer was used instead of the reaction gas composition for forming a high refractive index layer. Thus, polarizing plate protective films 10, 11, and 12 was obtained from optical film samples 7, 8 and 9, respectively.

| (Composition for forming a low refractive index layer) | |
|---|---|
| Inert gas: argon | 98.2% by volume |
| Reactive gas: tetramethoxysilane vapor (bubbled with argon gas) | 0.3% by volume |
| Hydrogen gas | 1.5% by volume |

Employing polarizing plate protective films 10, 11, and 12, polarizing plates 1, 2, and 3 were prepared.

Preparation of Polarizing Plate

Employing polarizing plate protective films 10, 11, and 12, polarizing plate samples 1 through 3 were prepared according to the following procedures, and evaluated.

1. Preparation of Polarizing Film

A 120 µm thick polyvinyl alcohol film was uniaxially stretched (at 110° C. by a factor of 5). The resulting film was immersed for 60 seconds in an aqueous solution comprised of 0.075 g of iodine, 5 g of potassium iodide, and 100 g of water, further immersed at 68° C. in an aqueous solution comprised of 6 g of potassium iodide, 7.5 g of boric acid, and 100 g of water, washed with water, and dried. Thus, a polarizing film was obtained.

2. Preparation of Polarizing Plate

The polarizing film obtained above and each of polarizing plate protective films 10, 11, and 12 were laminated to obtain a polarizing plate sample according to the following procedures 1 to 5.

Procedure 1: The polarizing plate protective film was cut to obtain two specimens with a size of 30 cm (in the mechanical direction)×18 cm (in the transverse direction).

The resulting specimens were immersed in an aqueous 2 mol/liter sodium hydroxide solution at 60° C. for 90 seconds, washed with water, and dried. The low refractive index layer of the resulting materials was laminated with a peelable protective film. Thus, two polarizing plate protective film samples were obtained.

Procedure 2: The polarizing film obtained above was cut into a size of 30 cm (in the mechanical direction)×18 cm (in the transverse direction), and immersed in a polyvinyl alcohol adhesive (with a solid content of 2% by weight) for 1 to 2 seconds to form an adhesive layer.

Procedure 3: The excessive adhesive of the adhesive layer on the polarizing film prepared in Procedure 2 was softly removed. The one polarizing plate protective film sample was laminated onto one surface of the resulting polarizing film and further, the other polarizing plate protective film sample was laminated onto the other surface of the polarizing film through the adhesive layer (with the low refractive index layers arranged outwardly). Thus, laminate sample was obtained.

Procedure 4: Pressure was applied through a hand roller to the laminate sample with a polarizing film and a polarizing plate protective film sample obtained in the Procedure 3 to remove foams or excessive adhesive from the ends of the laminate sample. The pressure applied by the hand roller was from 20 to 30 N/cm$^2$, and the roller speed was 2 m/min.

Procedure 5: The sample obtained in the Procedure 4 was dried at 80° C. for 2 minutes in a dryer. Thus, polarizing plate samples 1 through 3 were prepared employing polarizing plate protective film samples 10, 11, and 12, respectively.

(Preparation of Liquid Crystal Display Panel Sample)

The polarizing plate on the viewer side of the liquid crystal cell of a commercially available display panel (a color liquid crystal display MultiSync LCD1525J TYPE LA-1529HM, produced by NEC Co., Ltd.) was peeled. Subsequently, each of the polarizing plate samples 1 through 3 was superposed on the liquid crystal cell so that their polarizing direction was in accordance with the original one to obtain liquid crystal display panel samples 1, 2 and 3, respectively.

The polarizing plate samples 1 through 3 and liquid crystal display panel samples 1, 2 and 3 were visually observed, and evaluated for unevenness according to the following criteria:

A: No unevenness was observed.
B: Slight unevenness was observed.
C: Unevenness was observed.
D: Apparent unevenness was observed.

The results are shown in Table 6.

TABLE 6

|  | Polarizing plate sample No. | Polarizing plate protective film sample No. used | Optical film sample No. used | Unevenness (Visual observation) | Liquid crystal display panel sample No. | Unevenness (Visual observation) |
|---|---|---|---|---|---|---|
| Example 5 | 1 | 10 | 7 | A | 1 | A |
|  | 2 | 11 | 8 | A | 2 | A |
| Comparative example 2 | 3 | 12 | 9 | D | 3 | D |

Inv.: Inventive,
Comp.: Comparative

As is apparent from Table 6, the liquid crystal panel samples 1 and 2 (Inventive) employing polarizing plate samples 1 and 2 in the invention provided no unevenness, exhibiting an excellent displaying property, as compared with the liquid crystal panel sample 3 (comparative) employing polarizing plate sample 12. The liquid crystal panel sample 3 provided apparent unevenness.

EFFECTS OF THE INVENTION

The present invention provides a method of manufacturing a uniform thin multiple layer on a substrate continuously and at reduced cost according to plasma discharge at atmospheric pressure or at approximately atmospheric pressure, an optical film having on the surface the layer formed according to the method, and a polarizing plate or an image display employing the optical film.

The invention claimed is:

1. A method of forming a layer or layers, the method comprising the steps of:
   a) transporting a cellulose ester film to a gap formed between a first electrode and a second electrode opposing each other to make a plasma discharge; the cellulose ester film having a first surface and a second surface opposite to the first surface; the cellulose ester film having a hardened resin layer, which is prepared by polymerizing and hardening a monomer or an oligomer each having an ethylenically unsaturated double bond by an ultraviolet ray, on the first surface; and
   b) subjecting the hardened resin layer of the cellulose ester film to plasma discharge treatment to form a layer on the hardened resin layer at atmospheric pressure or at approximately atmospheric pressure while supplying a reactive gas to the gap.

2. The method of claim 1, wherein the cellulose ester film comprises a cellulose ester having a total acyl substitution degree of from 2.55 to 2.95.

3. The method of claim 1, wherein the cellulose ester film has a thickness of from 10 to 60 μm and a tensile strength of not less than $1.4 \times 10^2$ N/mm$^2$.

4. The method of claim 1, wherein each of (i) the layer formed by plasma discharge treatment on a hardened resin layer of the cellulose ester film and (ii) the cellulose ester film prepared by a solution cast film manufacturing method, is subjected to stretching in the transverse direction before the step of producing a hardened resin layer by polymerizing and hardening a monomer or an oligomer; and have an ethylenically unsaturated double bond on the first surface.

* * * * *